United States Patent
Li et al.

(10) Patent No.: US 11,227,922 B2
(45) Date of Patent: Jan. 18, 2022

(54) SLOPED EPITAXY BURIED CONTACT

(71) Applicant: International Business Machines Corporation, Armonk, NY (US)

(72) Inventors: Tao Li, Albany, NY (US); Tsung-Sheng Kang, Ballston Lake, NY (US); Ruilong Xie, Niskayuna, NY (US); Alexander Reznicek, Troy, NY (US); Oleg Gluschenkov, Tannersville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/905,626

(22) Filed: Jun. 18, 2020

(65) Prior Publication Data

US 2021/0399098 A1 Dec. 23, 2021

(51) Int. Cl.
*H01L 21/02* (2006.01)
*H01L 21/285* (2006.01)
(Continued)

(52) U.S. Cl.
CPC .. *H01L 29/41733* (2013.01); *H01L 21/02603* (2013.01); *H01L 21/28518* (2013.01); *H01L 21/3065* (2013.01); *H01L 21/76805* (2013.01); *H01L 21/76895* (2013.01); *H01L 23/5286* (2013.01); *H01L 23/535* (2013.01); *H01L 23/53209* (2013.01); *H01L 23/53228* (2013.01);
(Continued)

(58) Field of Classification Search
CPC .......... H01L 29/41733; H01L 29/0673; H01L 29/42392; H01L 29/45; H01L 29/66742; H01L 29/78618; H01L 29/78696; H01L 21/02603; H01L 21/28518; H01L 21/3065; H01L 21/76805; H01L 21/76895; H01L 23/53209; H01L 23/53228; H01L 23/53242; H01L 23/53257; H01L 23/535
USPC ......................................................... 257/347
See application file for complete search history.

(56) References Cited

U.S. PATENT DOCUMENTS 7,002,187 B1 2/2006 Husher
9,287,123 B2 3/2016 Srinivasan et al.
(Continued)

OTHER PUBLICATIONS

Oda et al., "Optimizing the SiC Plasma Etching Process For Manufacturing Power Devices," CS ManTech Conference, pp. 125-128 (May 2015).
(Continued)

*Primary Examiner* — Tong-Ho Kim
(74) *Attorney, Agent, or Firm* — Jeffrey S. LaBaw; Michael J. Chang, LLC

(57) ABSTRACT

Semiconductor device designs having a buried power rail with a sloped epitaxy buried contact are provided. In one aspect, a semiconductor FET device includes: at least one gate disposed on a substrate; source and drains on opposite sides of the at least one gate, wherein at least one of the source and drains has a sloped surface; a buried power rail embedded in the substrate; and a buried contact that connects the buried power rail to the sloped surface of the at least one source and drain. Sidewall spacers separate the buried power rail from the substrate. A top of the sloped surface of the at least one source and drain is above a top surface of the buried contact. Methods of forming a semiconductor FET device are also provided.

21 Claims, 12 Drawing Sheets

(51) Int. Cl.
*H01L 21/306* (2006.01)
*H01L 21/768* (2006.01)
*H01L 23/528* (2006.01)
*H01L 23/532* (2006.01)
*H01L 23/535* (2006.01)
*H01L 29/06* (2006.01)
*H01L 29/417* (2006.01)
*H01L 29/423* (2006.01)
*H01L 29/45* (2006.01)
*H01L 29/66* (2006.01)
*H01L 29/786* (2006.01)
*H01L 21/3065* (2006.01)

(52) U.S. Cl.
CPC .. *H01L 23/53242* (2013.01); *H01L 23/53257* (2013.01); *H01L 29/0673* (2013.01); *H01L 29/42392* (2013.01); *H01L 29/45* (2013.01); *H01L 29/66742* (2013.01); *H01L 29/78618* (2013.01); *H01L 29/78696* (2013.01)

(56) References Cited

U.S. PATENT DOCUMENTS

| | | |
|---|---|---|
| 9,570,395 B1 | 2/2017 | Sengupta et al. |
| 10,236,292 B1 | 3/2019 | Frougier et al. |
| 10,388,519 B2 | 8/2019 | Smith et al. |
| 10,566,246 B1* | 2/2020 | Wu ............... H01L 29/456 |
| 2020/0135578 A1* | 4/2020 | Ching ............ H01L 27/0886 |
| 2020/0203210 A1* | 6/2020 | Yakimets ........ H01L 21/481 |
| 2020/0411436 A1* | 12/2020 | Xie ............... H01L 29/0673 |

OTHER PUBLICATIONS

Ryckaert et al., "The Complementary FET (CFET) for CMOS scaling beyond N3," published in the 2018 Symposium on VLSI Technology Digest of Technical Papers, pp. 141-142 (Jun. 2018).

* cited by examiner

SLOPED EPITAXY BURIED CONTACT

FIELD OF THE INVENTION

The present invention relates to semiconductor device designs having a buried power rail, and more particularly, to semiconductor device designs having a buried power rail with a sloped epitaxy buried contact architecture for optimal contact resistance and low parasitic capacitance, and techniques for fabrication thereof.

BACKGROUND OF THE INVENTION

With the continued scaling of semiconductor device architecture, the aspect of power delivery to the semiconductor devices presents some notable challenges. Namely, the interconnect lines that deliver power to the semiconductor devices can only be reduced in size so much before device performance is negatively impacted.

One approach to eliminate congestion in the device design is to bury the power rails that bring power to the semiconductor devices in the substrate, rather than locating them above the semiconductor devices. Power rails configured in this manner are also referred to herein as 'buried power rails.'

While buried power rail designs free up some overhead space above the devices, traditional device designs still require a relatively large contact structure to connect the buried power rail to the source and drain. These large contact structures undesirably lead to a large contact-to-gate parasitic capacitance.

Thus, improved semiconductor device designs having a buried power rail but minimal parasitic capacitance would be desirable.

SUMMARY OF THE INVENTION

The present invention provides semiconductor device designs having a buried power rail with a sloped epitaxy buried contact architecture for optimal contact resistance and low parasitic capacitance, and techniques for fabrication thereof. In one aspect of the invention, a semiconductor field-effect transistor (FET) device is provided. The semiconductor FET includes: at least one gate disposed on a substrate; source and drains on opposite sides of the at least one gate, wherein at least one of the source and drains has a sloped surface; a buried power rail embedded in the substrate; and a buried contact that connects the buried power rail to the sloped surface of the at least one source and drain.

In another aspect of the invention, another semiconductor FET device is provided. The semiconductor FET includes: at least one gate disposed on a substrate; source and drains on opposite sides of the at least one gate, wherein at least one of the source and drains has a sloped surface; a buried power rail embedded in the substrate below the sloped surface; sidewall spacers separating the buried power rail from the substrate; and a buried contact that connects the buried power rail to the sloped surface of the at least one source and drain, wherein a top of the sloped surface of the at least one source and drain is above a top surface of the buried contact.

In yet another aspect of the invention, a method of forming a semiconductor FET device is provided. The method includes: forming a device structure having at least one gate disposed on a substrate, source and drains on opposite sides of the at least one gate, and a buried power rail embedded in the substrate; etching at least one of the source and drain to produce a sloped surface along a portion of the at least one source and drain; and forming a buried contact that connects the buried power rail to the sloped surface of the at least one source and drain, wherein a top of the sloped surface of the at least one source and drain is above a top surface of the buried contact.

In still yet another aspect of the invention, another method of forming a semiconductor FET device is provided. The method includes: forming a device structure having at least one gate disposed on a substrate, source and drains on opposite sides of the at least one gate, an interlayer dielectric (ILD) surrounding the at least one gate, and a buried power rail embedded in the substrate; patterning a contact trench in the ILD to expose at least one of the source and drains; etching that at least one source and drain to produce a sloped surface along a portion of the at least one source and drain exposed in the contact trench; performing epitaxial re-growth to form a surface dopant-semiconductor alloy contact layer on the sloped surface; and forming a buried contact in the contact trench that connects the buried power rail to the sloped surface of the at least one source and drain, wherein a top of the sloped surface of the at least one source and drain is above a top surface of the buried contact.

A more complete understanding of the present invention, as well as further features and advantages of the present invention, will be obtained by reference to the following detailed description and drawings.

DETAILED DESCRIPTION OF PREFERRED EMBODIMENTS

As provided above, the use of a buried power rail can eliminate overhead congestion in semiconductor device designs. With a buried power rail design, the interconnects that supply power to the semiconductor devices are buried in the substrate beneath the devices. However, conventional buried power rail designs still require relatively large contact structures over the source and drains to reduce contact resistance. As a result, a significant amount of contact-to-gate parasitic capacitance is still present.

Advantageously, provided herein are semiconductor device designs featuring a buried power rail for scaling benefits and a sloped epitaxy buried contact architecture for optimizing contact resistance to the source and drains. Since the sloped design minimizes contact resistance, the overall footprint of the present sloped contact design can be minimized desirably leading to a decreased contact-to-gate parasitic capacitance.

Figure 1:
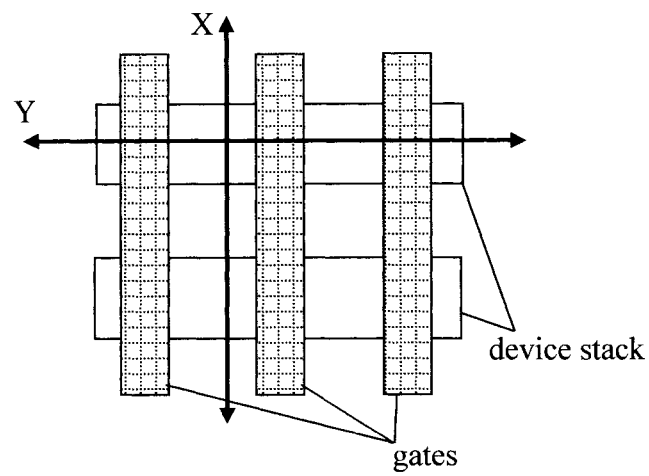
FIG. 1 is a top-down view of the general semiconductor field-effect transistor (FET) design presented herein having device stacks and gates oriented orthogonal to the device stacks according to an embodiment of the present invention.

An exemplary methodology for forming a semiconductor field-effect transistor (FET) device in accordance with the present techniques is now described by way of reference to FIGS. 1-18. In each of the following figures, a cross-sectional view through a part of the semiconductor FET device will be shown. See, for example, FIG. 1 which shows a top-down view of the general semiconductor FET device design showing the orientations of the various cuts through the device that will be depicted in the figures. Referring to FIG. 1, the present semiconductor FET device includes device stacks of sacrificial and active layers, with gates of the semiconductor FET device oriented orthogonal to the device stacks. Sacrificial gates are shown in FIG. 1. Namely, as will be described in detail below, a replacement metal gate or RMG process is employed herein where these sacrificial gates serve as placeholders during source and drain formation, and then are later replaced with the replacement metal gates. However, the orientation of the gates with respect to the device stack is the same for both the sacrificial and replacement metal gates.

Figure 2:
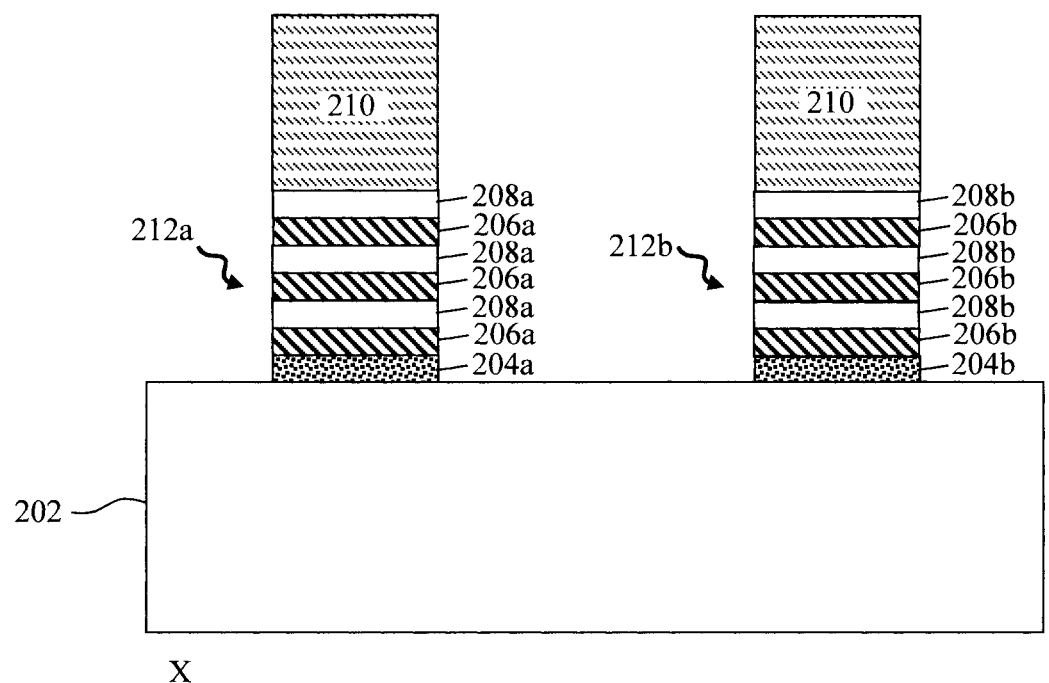
FIG. 2 is a cross-sectional diagram illustrating formation of device stacks (e.g., a first device stack, a second device stack, etc.) on a substrate using a hardmask, wherein each of the device stacks includes a first sacrificial layer deposited on the substrate, and alternating second sacrificial layers and active layers deposited on the first sacrificial layer from a cross-sectional view through the device stacks between two of the gates in a source and drain region of the device according to an embodiment of the present invention.

As shown in FIG. 1, a cross-section X will provide views of cuts through the device stacks between two of the gates in a source and drain region of the device. A cross-section Y will provide views of cuts through the center of one of the device stacks perpendicular to the gates. For instance, as shown in FIG. 2 (a cross-sectional view X), the process begins with the formation of at least one device stack 212a,b, etc. on a substrate 202. According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 202 may already have pre-built structures (not shown) such as transistors, diodes, capacitors, resistors, interconnects, wiring, etc.

According to an exemplary embodiment, formation of device stacks 212a,b, etc. involves first depositing sacrificial and active layers, oriented vertically one on top of another, as a stack on substrate 202 and then using standard lithography and etching techniques to pattern the sacrificial/active layers into the individual device stacks 212a,b, etc. By way of example only, in one exemplary embodiment, the sacrificial and active layers are nanosheets that are formed as a stack on substrate 202. The term 'nanosheet,' as used herein, generally refers to a sheet or a layer having nanoscale dimensions. Further, the term 'nanosheet' is meant to encompass other nanoscale structures such as nanowires. For instance, the term 'nanosheet' can refer to a nanowire with a larger width, and/or the term 'nanowire' can refer to a nanosheet with a smaller width, and vice versa.

With standard lithography and etching processes, a lithographic stack (not shown), e.g., photoresist/organic planarizing layer (OPL)/anti-reflective coating (ARC), is used to pattern hardmasks 210 with the footprint and location of each of the device stacks 212a,b, etc. Suitable hardmask materials include, but are not limited to, nitride hardmask materials such as silicon nitride (SiN), silicon oxynitride (SiON), silicon carbide nitride (SiCN), and/or oxide hardmask materials such as silicon oxide (SiOx). Alternatively, hardmasks 210 can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern from the hardmasks 210 to the underlying stack of sacrificial and active layers. A directional (anisotropic) etching process such as reactive ion etching (RIE) can be employed for the stack etch.

As shown in FIG. 2, the present device stacks 212a,b, etc. specifically include (first) sacrificial layers 204a,b, etc. deposited on the substrate 202, and alternating layers of (second) sacrificial layers 206a,b, etc. and active layers 208a,b, etc. deposited on sacrificial layer 204a,b, etc. The term 'sacrificial' as used herein refers to a structure that is removed, in whole or in part, during fabrication of the semiconductor FET device. By contrast, active layers active layers 208a,b, etc. will remain in place and serve as channels of the semiconductor FET device. It is notable that the number of sacrificial layers 206a,b, etc. and active layers 208a,b, etc. shown in the figures is provided merely as an example to illustrate the present techniques. For instance, embodiments are contemplated herein where more or fewer sacrificial layers 206a,b, etc. and/or more or fewer active layers 208a,b, etc. are present than is shown.

According to an exemplary embodiment, the sacrificial layers 204a,b, etc. and each of the sacrificial layers 206a,b, etc./active layers 208a,b, etc. are deposited/formed on substrate 202 using an epitaxial growth process. In one exemplary embodiment, the sacrificial layers 204a,b, etc. and the sacrificial layers 206a,b, etc./active layers 208a,b, etc. each have a thickness of from about 10 nanometers (nm) to about 25 nm and ranges therebetween.

As described above, the sacrificial and active layers are first blanket deposited/formed on the substrate 202, and then patterned into the individual device stacks 212a,b, etc. Thus, based on this process, the sacrificial layers 204a,b, etc. will all have the same composition and thickness in each of the device stacks 212a,b, etc., as will the sacrificial layers 206a,b, etc. and active layers 208a,b, etc. The materials employed for sacrificial layers 206a,b, etc. and active layers 208a,b, etc. are such that the sacrificial layers 206a,b, etc. can be removed selective to the active layers 208a,b, etc. during fabrication. Further, as will be described in detail below, the material employed for sacrificial layers 204a,b, etc. needs to be such that sacrificial layers 204a,b, etc. can be removed selective to sacrificial layers 206a,b, etc. during fabrication in order to form a bottom dielectric isolation layer.

For instance, according to an exemplary embodiment, sacrificial layers 204a,b, etc. and sacrificial layers 206a,b, etc. each are formed from SiGe, while active layers 208a,b, etc. are formed from Si. Etchants such as wet hot SC1, vapor phase hydrogen chloride (HCl), vapor phase chlorine trifluoride ($ClF_3$) and other reactive clean processes (RCP) are selective for etching of SiGe versus Si.

Further, high germanium (Ge) content SiGe can be removed selective to low Ge content SiGe using an etchant such as dry HCl. Thus, according to an exemplary embodiment, sacrificial layers 204a,b, etc. are formed from SiGe having a high Ge content. For instance, in one exemplary embodiment, a high Ge content SiGe is SiGe having from about 50% Ge to about 100% Ge (i.e., pure Ge) and ranges therebetween. For instance, in one non-limiting example, sacrificial layers 204a,b, etc. are formed from SiGe60 (which is SiGe having a Ge content of about 60%). Use of a higher Ge content SiGe will enable the sacrificial layers 204a,b, etc. to be etched selective to sacrificial layers 206a,b, etc. when forming the bottom dielectric isolation layer (see below). In that case, sacrificial layers 206a,b, etc. are preferably formed from a low Ge content SiGe. For instance, in one exemplary embodiment, a low Ge content SiGe is SiGe having from about 20% Ge to about 50% Ge and ranges therebetween. For instance, in one non-limiting example, sacrificial layers 206a,b, etc. are formed from SiGe30 (which is SiGe having a Ge content of about 30%).

Shallow trench isolation (STI) techniques are then employed to isolate the device stacks 212a,b, etc. STI generally involves patterning a trench(es) in a substrate, and then filling the trench with a dielectric such as an oxide (which may also be generally referred to herein as an 'STI oxide'). Although not explicitly shown in the figures, a liner (e.g., a thermal oxide or silicon nitride (SiN)) may be deposited into the trench(es) prior to the STI oxide.

Figure 3:
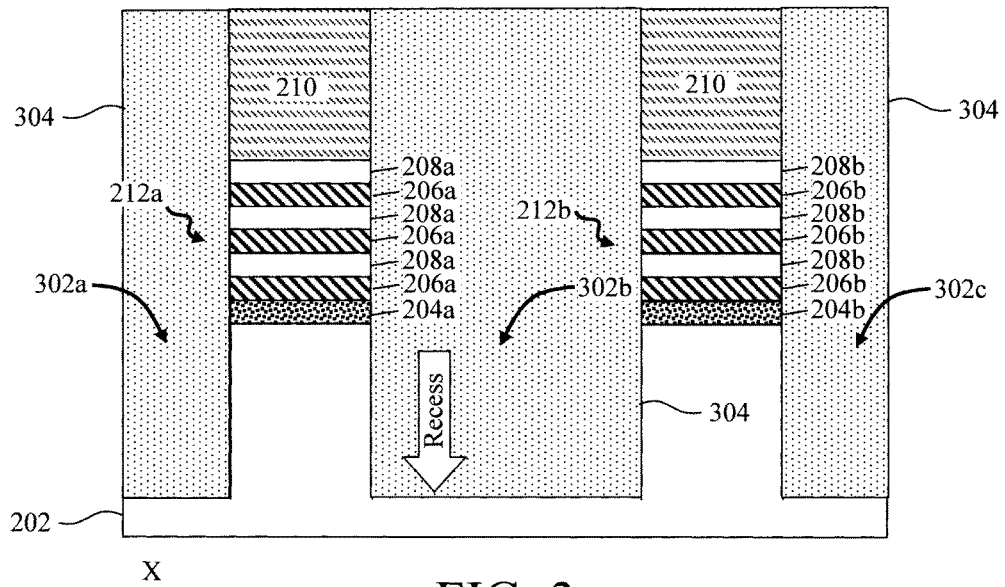
FIG. 3 is a cross-sectional diagram illustrating the substrate having been recessed, forming trenches in the substrate at the base of the device stacks, the device stacks having been buried in a shallow trench isolation (STI) oxide which fills the trenches from a cross-sectional view through the device stacks between two of the gates in a source and drain region of the device according to an embodiment of the present invention.
Figure 4:
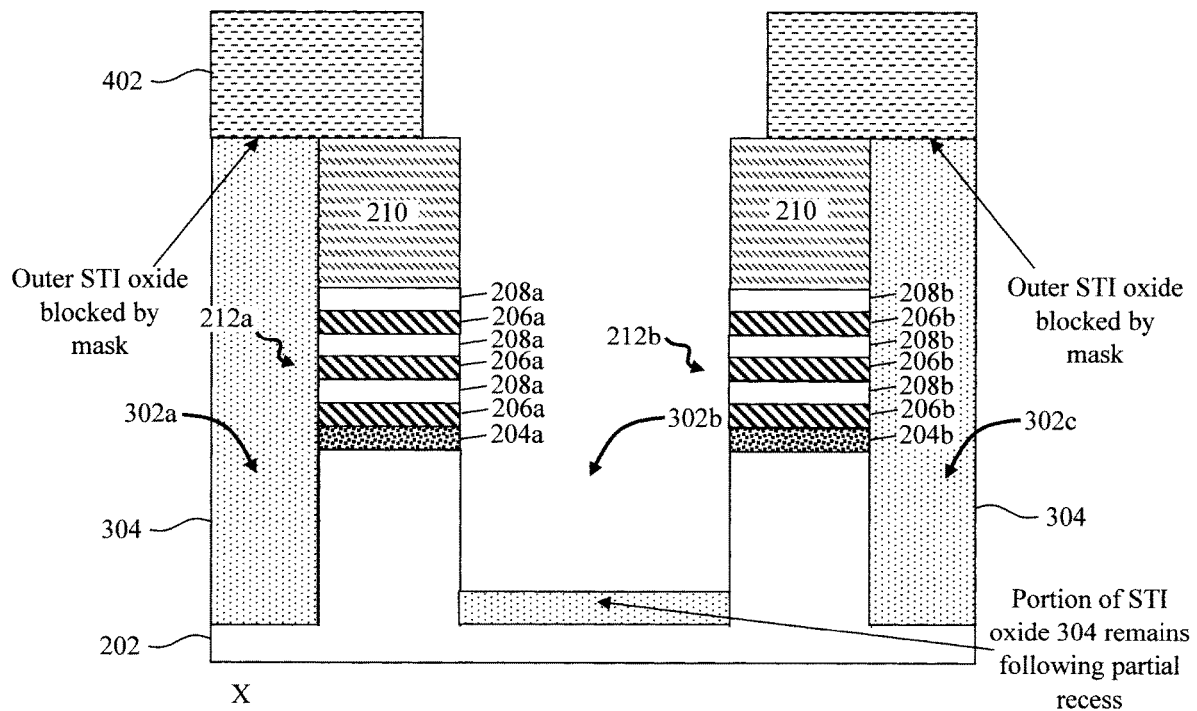
FIG. 4 is a cross-sectional diagram illustrating a partial recess etch of the STI oxide having been performed in the trench between the adjacent device stacks from a cross-sectional view through the device stacks between two of the gates in a source and drain region of the device according to an embodiment of the present invention.

To begin the STI process, substrate 202 is first recessed, forming trenches 302a,b,c, etc. in the substrate 202 at the base of the device stacks 212a,b, etc. See FIG. 3 (a cross-sectional view X). By way of example only, the recess of substrate 202 can be carried out using a directional (anisotropic) etching process such as RIE. Hardmasks 210 protect the device stacks 212a,b, etc. during the recess etch. The device stacks 212a,b, etc. are then buried in an STI oxide 304 which, as shown in FIG. 3, fills the trenches 302a,b,c, etc. Suitable STI oxides 304 include, but are not limited to, oxide low-κ materials such as silicon oxide (SiOx) and/or oxide ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH). A process such as chemical vapor deposition (CVD), atomic layer deposition (ALD), or physical vapor deposition (PVD) can be used to deposit the STI oxide 304. Following deposition, the STI oxide 304 can be planarized using a process such as chemical mechanical polishing (CMP). As shown in FIG. 3, a top surface of STI oxide 304 is now coplanar with a top surface of hardmasks 210.

In the present example, a buried power rail will be formed in between the adjacent device stacks 212a,b, etc. To do so, a selective recess of the STI oxide 304 that is present in between the adjacent device stacks 212a,b, etc. and in trench 302b is next performed. The goal of the STI oxide 304 recess is to partially recess only the STI oxide 304 that is present in between the adjacent device stacks 212a,b, etc. and in trench 302b. In other words, the STI oxide 304 on the opposite/outer sides of the device stacks 212a,b, etc. and in trenches 302a and 302c should remain intact. As such, a patterned block mask 402 is first formed on the STI oxide 304 covering/masking the STI oxide 304 on the outer sides of the device stacks 212a,b, etc. See FIG. 4 (a cross-sectional view X). Suitable materials for the block mask 402 include, but are not limited to, an organic planarizing layer (OPL) material.

A partial recess etch of STI oxide 304 in between the adjacent device stacks 212a,b, etc. and in trench 302b is next performed. By way of example only, the recess of the STI oxide 304 can be carried out using a directional (anisotropic) etching process such as RIE. By 'partial' it is meant that, following the recess, a portion of the STI oxide 304 remains on the substrate 202 at the bottom of trench 302b. See, e.g., FIG. 4.

Figure 5:
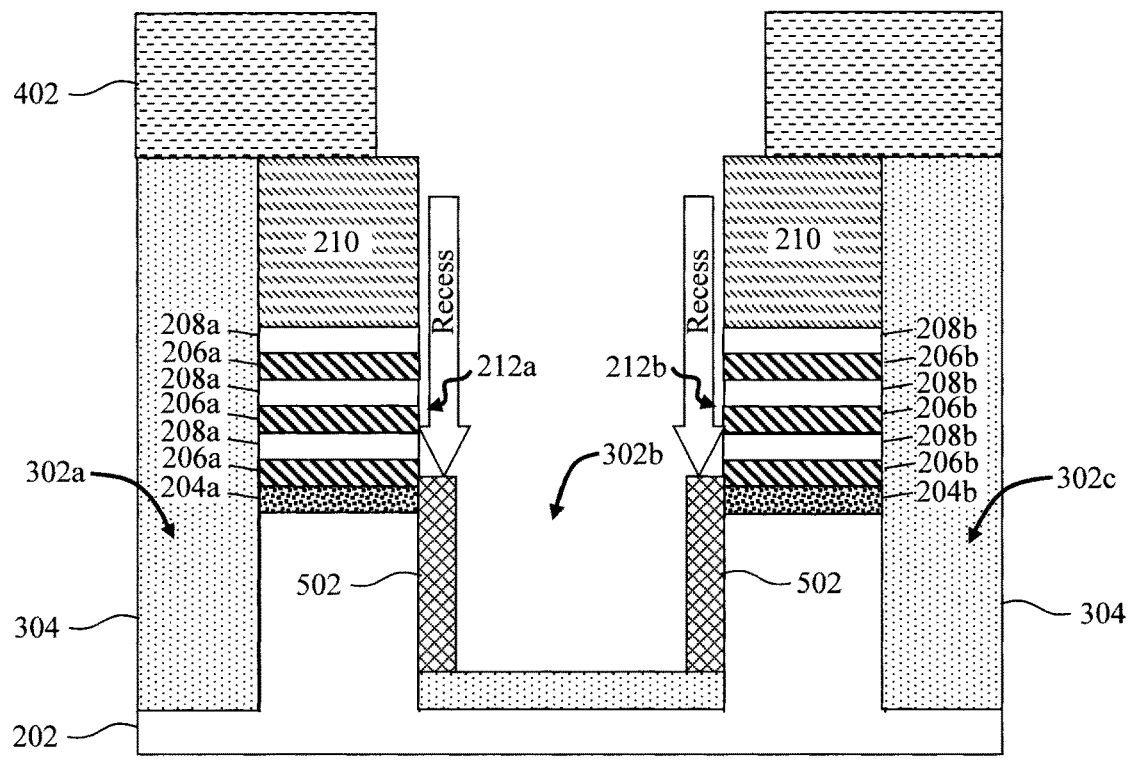
FIG. 5 is a cross-sectional diagram illustrating sidewall spacers having been formed at the base of the device stacks along the sidewalls of the trench between the adjacent device stacks from a cross-sectional view through the device stacks between two of the gates in a source and drain region of the device according to an embodiment of the present invention.

Sidewall spacers 502 are then formed at the base of the device stacks 212a,b, etc. along the sidewalls of trench 302b in between the adjacent device stacks 212a,b, etc. See FIG. 5 (a cross-sectional view X). According to an exemplary embodiment, sidewall spacers 502 are formed by first depositing a suitable spacer material over the device stacks 212a,b, etc. and then using a directional (anisotropic) etching process such as RIE to pattern the spacer material into individual spacers along the device stack sidewall. Suitable spacer materials for sidewall spacers 502 include, but are not limited to, silicon carbide (SiC) and/or silicon oxycarbide (SiOC). Naturally, the spacers can only be formed along the sidewalls of the device stacks that are exposed, namely the sidewalls in between the adjacent device stacks 212a,b, etc. over trench 302b. Initially, a full-length sidewall spacer is formed along the exposed sidewalls. However, as shown in FIG. 5, the sidewall spacers 502 are then recessed.

As will become apparent from the description that follows, the sidewall spacers 502 will serve as a protecting layer that separates/isolates the buried power rail from the substrate 202. Thus, the recessed sidewall spacers 502 still need to cover the substrate 202 along the sidewalls of trench 302b. According to an exemplary embodiment, the recessed sidewall spacers 502 cover the substrate 202 along the sidewalls of trench 302b, and the sacrificial layers 204a,b, etc. (and optionally a portion of the bottom most sacrificial layer 206a,b, etc.) along the sidewalls of the device stacks 212a,b, etc. as shown in FIG. 5.

Figure 6:
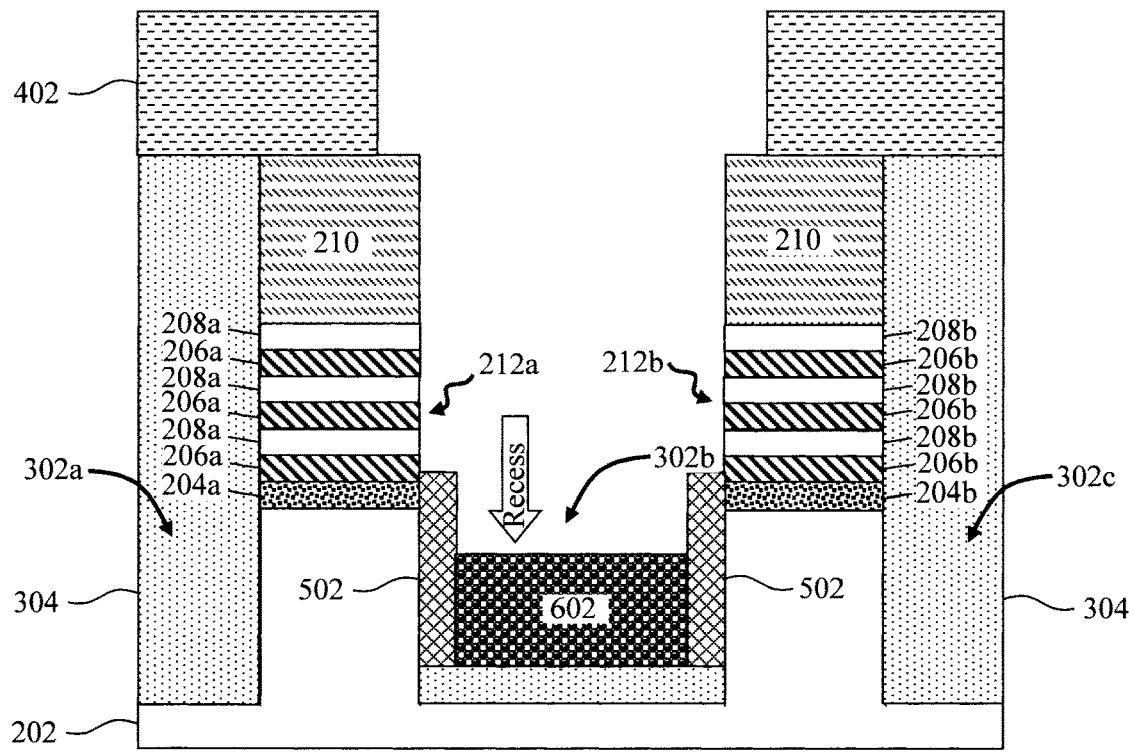
FIG. 6 is a cross-sectional diagram illustrating buried power rail having been formed in the trench between the sidewall spacers from a cross-sectional view through the device stacks between two of the gates in a source and drain region of the device according to an embodiment of the present invention.

A buried power rail 602 is then formed in trench 302b in between sidewall spacers 502. See FIG. 6 (a cross-sectional view X). According to an exemplary embodiment, buried power rail 602 is formed by depositing a metal or combination of metals into the trench 302b, and then using an etch to selectively recess the metal(s) below a top surface of the sidewall spacers 502. Suitable metals for buried power rail 602 include, but are not limited to, copper (Cu), cobalt (Co), ruthenium (Ru) and/or tungsten (W). A process such as sputtering, evaporation or electrochemical plating can be employed to deposit the metal(s) into trench 302b. A metal-selective etch can be employed to recess the buried power rail 602. According to an exemplary embodiment, the buried power rail 602 a top surface of the recessed buried power rail 602 is below sacrificial layers 204a,b, etc. of the device stacks 212a,b, etc. as shown in FIG. 6. Following formation of the buried power rail 602, any remaining block mask 402 is removed. By way of example only, an OPL block mask can be removed using an ashing process.

Following removal of the block mask 402, additional dielectric 702 is next deposited onto the device structure including into trench 302b over the buried power rail 602, followed by CMP. The dielectric 702 and STI oxide 304 is then recessed, and any remaining hardmasks 210 are removed. See FIG. 7 (a cross-sectional view X). Suitable materials for dielectric 702 include, but are not limited to, oxide low-κ materials such as SiOx and/or oxide ULK-ILD materials such as pSiCOH. By way of example only, the recess of dielectric 702 and STI oxide 304 can be carried out using a directional (anisotropic) etching process such as RIE. Based on this process, buried power rail 602 is now embedded in substrate 202 at the base of the device stacks 212a,b, etc., e.g., in between device stack 212a and device stack 212b. However, STI oxide 304 and sidewall spacers 502 separate buried power rail 602 from the substrate 202.

Figure 7:
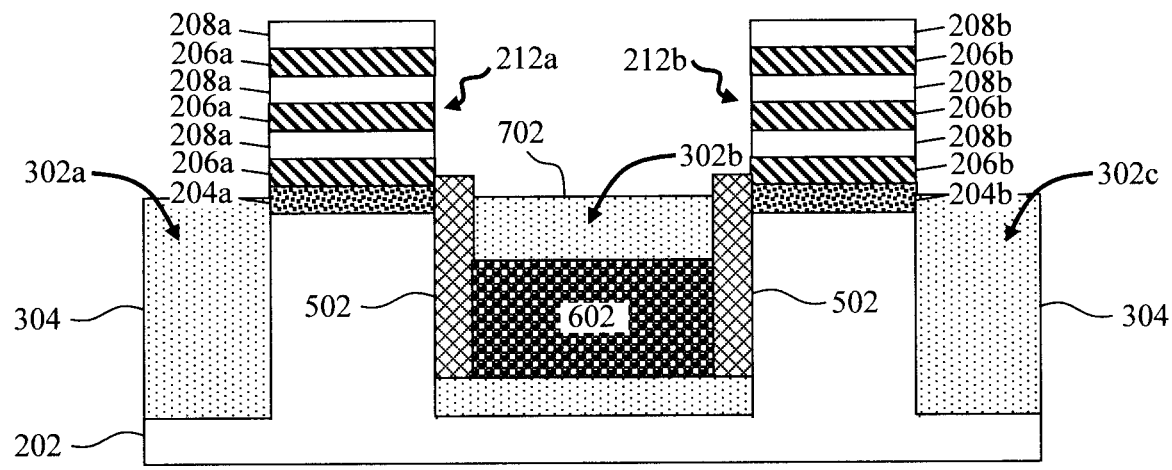
FIG. 7 is a cross-sectional diagram illustrating additional dielectric having been deposited into the trench over the buried power rail, and recessed along with the STI oxide from a cross-sectional view through the device stacks between two of the gates in a source and drain region of the device according to an embodiment of the present invention.

As shown in FIG. 7, a top surface of dielectric 702 is now below a top of the sidewall spacers 502, and a top surface of the STI oxide 304, which is substantially coplanar with the top surface of dielectric 702, is below a top surface of the sacrificial layers 204a,b, etc. in each of the device stacks 212a,b, etc. As will be described in detail below, exposure of sacrificial layers 204a,b, etc. along the sidewalls of the device stacks 212a,b, etc. will enable replacement of the sacrificial layers 204a,b, etc. with a bottom dielectric isolation layer. A bottom dielectric isolation layer prevents source-to-drain leakage via the substrate 202.

As described above, a replacement metal gate or RMG process is employed whereby sacrificial gates are placed early on in the process to enable formation of the source and drains. The sacrificial gates are later removed and replaced with replacement metal gates. To illustrate the replacement metal gate process and associated steps, reference will now be made to cross-sections Y of the device structure which, as highlighted above, provide views of cuts through the center of one of the device stacks perpendicular to the gates.

Figure 8:
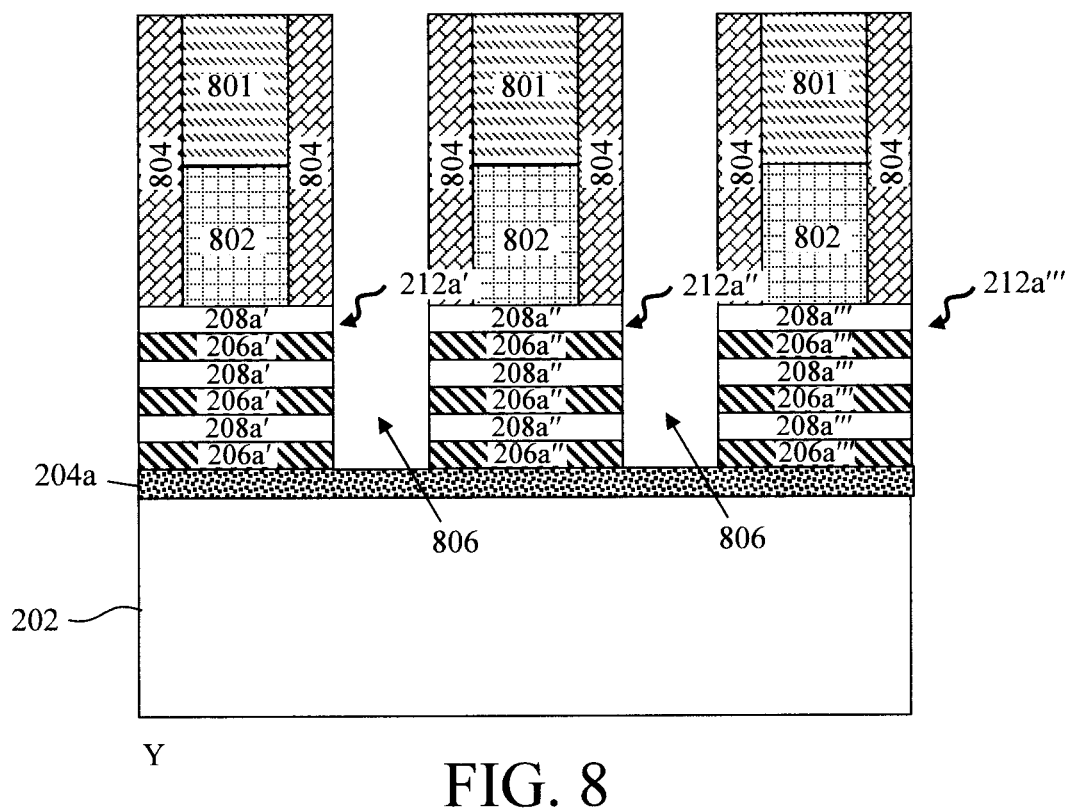
FIG. 8 is a cross-sectional diagram illustrating sacrificial gates and sacrificial gate hardmasks having been formed on the device stacks, dielectric spacers having been formed alongside the sacrificial gate hardmasks and sacrificial gates, and the sacrificial gates and dielectric spacers having been used as a mask to pattern trenches in the device stacks in between the sacrificial gates from a cross-sectional view through the center of one of the device stacks perpendicular to the gates according to an embodiment of the present invention.
Figure 9:
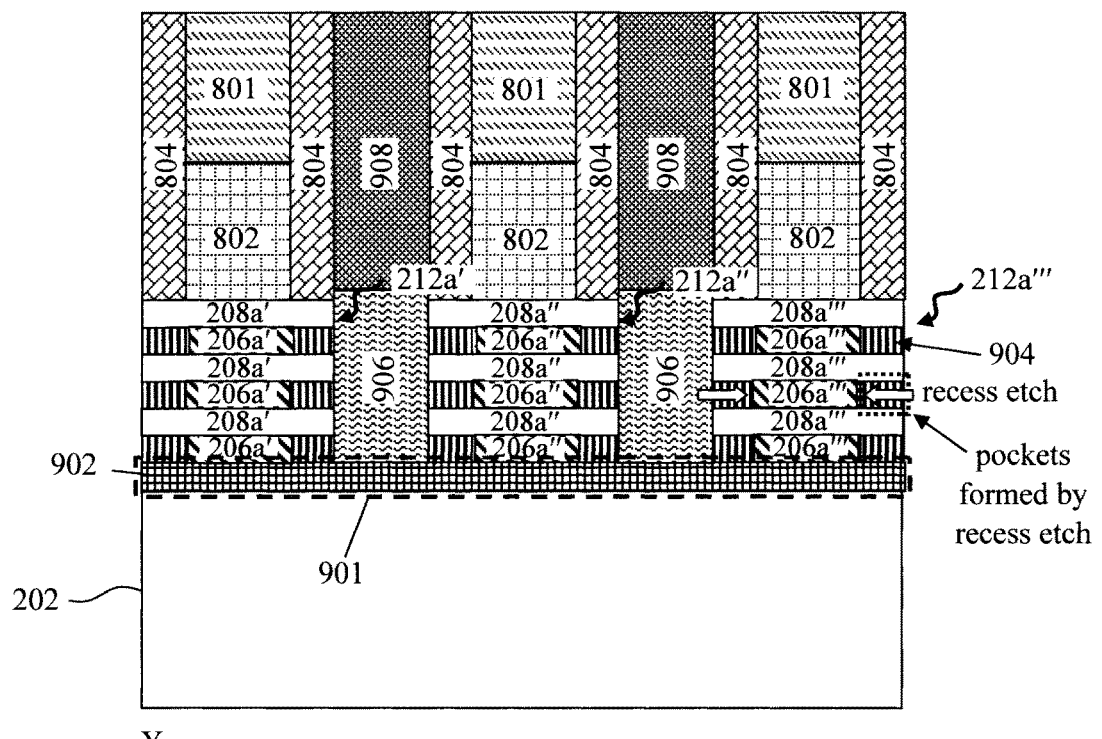
FIG. 9 is a cross-sectional diagram illustrating the first sacrificial layer having been selectively removed and replaced with a bottom dielectric isolation layer, inner spacers having been formed alongside the sacrificial layers, source and drains having been formed on opposite sides of the active layers, and the sacrificial gates having been surrounded in an interlayer dielectric (ILD) from a cross-sectional view through the center of one of the device stacks perpendicular to the gates according to an embodiment of the present invention.
Figure 10:
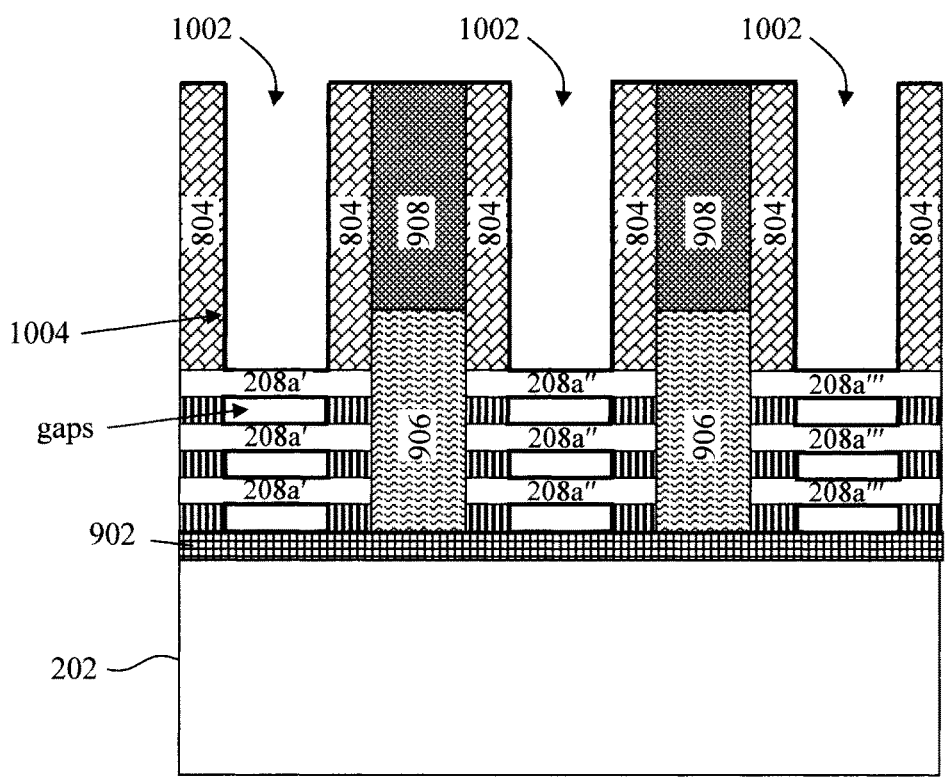
FIG. 10 is a cross-sectional diagram illustrating the sacrificial gates having been selectively removed forming gate trenches in the ILD, the sacrificial layers having been selectively removed through the gate trenches forming gaps in between the active layers, and a conformal gate dielectric having been deposited into and lining each of the gate trenches and gaps from a cross-sectional view through the center of one of the device stacks perpendicular to the gates according to an embodiment of the present invention.
Figure 11:
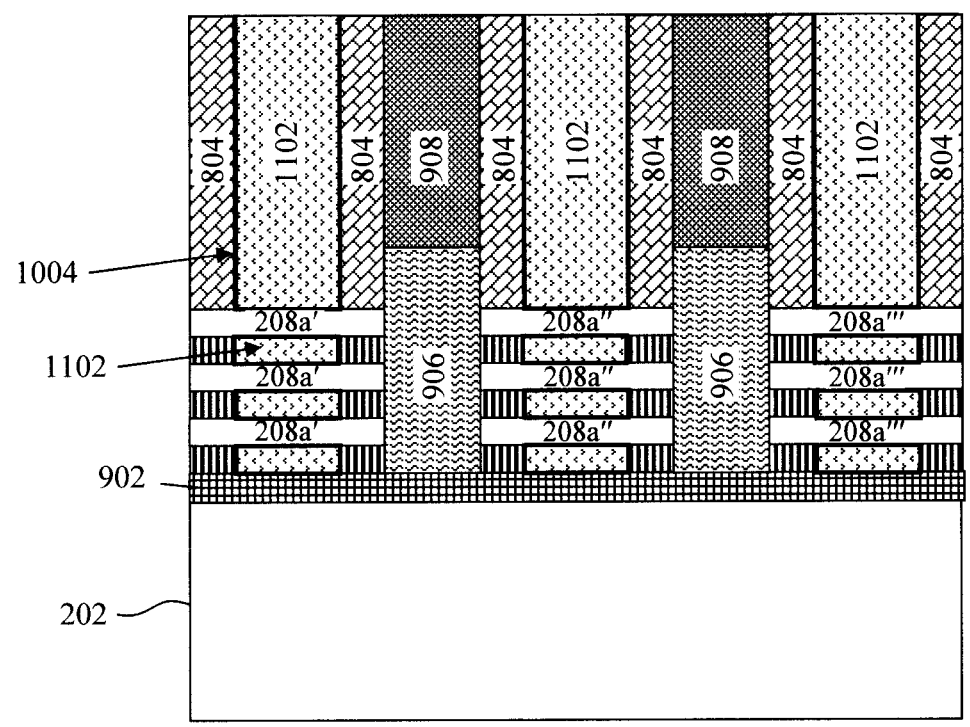
FIG. 11 is a cross-sectional diagram illustrating at least one workfunction-setting metal having been deposited into the gate trenches and gaps on the gate dielectric from a cross-sectional view through the center of one of the device stacks perpendicular to the gates according to an embodiment of the present invention.

Namely, as shown in FIG. 8 (a cross-sectional view Y), sacrificial gates 802 are then formed on the device stacks 212a,b, etc. over channel regions of the semiconductor FET. See FIG. 8. FIG. 8 provides a view of a cut through device stack 212a. However, the process flow is the same for device stack 212b. To form sacrificial gates 802, a sacrificial gate material is first blanket deposited over the device stacks 212a,b, etc. Suitable sacrificial gate materials include, but are not limited to, ploy-silicon (poly-Si) and/or amorphous silicon (a-Si). A process such as CVD, ALD or PVD can be employed to deposit the sacrificial gate material over the device stacks 212a,b, etc.

Sacrificial gate hardmasks 801 are then formed on the sacrificial gate material marking the footprint and location of each of the sacrificial gates 802. Suitable materials for the sacrificial gate hardmasks 801 include, but are not limited to, nitride hardmask materials such as SiN, SiON and/or silicon carbide nitride (SiCN), and/or oxide hardmask materials such as SiOx. An etch using the sacrificial gate hardmasks 801 is then used to pattern the sacrificial gate material into the individual sacrificial gates 802 shown in FIG. 8. A directional (anisotropic) etching process such as RIE can be employed for the sacrificial gate etch.

As shown in FIG. 8, dielectric spacers 804 are then formed alongside the sacrificial gate hardmasks 801 and sacrificial gates 802. Suitable materials for dielectric spacers 804 include, but are not limited to, SiOx, SiC and/or SiCO. A process such as CVD, ALD or PVD can be employed to deposit the dielectric spacers 804 alongside the sacrificial gate hardmasks 801/sacrificial gates 802.

As highlighted above, sacrificial gates 802 will serve as a placeholder for the final gates of the semiconductor FET device. Specifically, sacrificial gates 802 will be removed later on in the process and replaced with metal gate stacks that will serve as the final gates of the semiconductor FET device. Thus, these final gates of the semiconductor FET device are also referred to herein as "replacement metal gates" or simply "RMG." Use of a replacement metal gate process is advantageous because it prevents exposure of the metal gate stack materials to potentially damaging conditions during subsequent processing steps. For instance, the high-κ dielectrics used in the replacement metal gate stacks can be damaged by exposure to high temperatures. Thus, these gate stack materials are only placed near the end of the process.

Sacrificial gates 802 and dielectric spacers 804 are then used as a mask to pattern trenches 806 in device stack 212a in between the sacrificial gates 802. A directional (anisotropic) etching process such as RIE can be employed for the trench 806 etch. As shown in FIG. 8, trenches 806 extend through each of the sacrificial layers 206a and active layers 208a, stopping on sacrificial layer 204a. Although not shown in the figures, the same processes are employed to form sacrificial gates, dielectric spacers and trenches in device stack 212b.

As shown in FIG. 8, this etch patterns device stack 212a into multiple individual FET stacks 212a', 212a" and 212a'". The patterned portions of the sacrificial layers 206a and active layers 208a are now also designated as 206a', 206a" and 206a'" and 208a', 208a" and 208a'", respectively.

The sacrificial layer 204a is then selectively removed and replaced with a bottom dielectric isolation layer 902. See FIG. 9 (a cross-sectional view Y). For instance, as provided above, sacrificial layer 204a can be formed from high Ge content SiGe (e.g., SiGe having from about 50% Ge to about 100% Ge (i.e., pure Ge) and ranges therebetween, such as SiGe60. In that case, an etchant such as dry HCl can be used to remove sacrificial layer 204a forming a cavity 901 (shown with dashed lines) at the bottom of the device stack 212a. A dielectric material is then deposited into the cavity 901 to form the bottom dielectric isolation layer 902 shown in FIG. 9. Suitable dielectric materials for bottom dielectric isolation layer 902 include, but are not limited to, SiOx and/or SiN. A process such as CVD, ALD or PVD can be employed to deposit the dielectric material into cavity 901. As provided above, the bottom dielectric isolation layer 902 is used to prevent source-to-drain leakage via the substrate 202. Although not shown in the figures, the same processes are employed to remove and replace sacrificial layer 204a with bottom dielectric isolation layer 902.

Source and drains are then formed in the trenches 806 on opposite sides of the sacrificial layers 206a', 206a" and 206a'" and active layers 208a', 208a" and 208a'". First, however, inner spacers 904 are formed alongside the sacrificial layers 206a', 206a" and 206a'". To do so, a selective etch is performed to laterally recess the sacrificial layers 206a', 206a" and 206a'" exposed along the sidewalls of FET stacks 212a', 212a" and 212a'". See FIG. 9. This recess etch forms pockets along the sidewalls of the FET stacks 212a', 212a" and 212a'" that are then filled with a spacer material to form inner spacers 904 within the pockets. These inner spacers 904 will offset the replacement metal gates from the source and drains (see below). As provided above, according to an exemplary embodiment, the sacrificial layers 206a', 206a" and 206a'" are formed from SiGe. In that case, a SiGe-selective non-directional (isotropic) etching process can be used for the recess etch. Suitable spacer materials for inner spacers 904 include, but are not limited to, silicon nitride (SiN), SiOx, SiC and/or SiCO. A process such as CVD, ALD or PVD can be employed to deposit the spacer material into the pockets. Excess spacer material is removed from the trenches 806 using a directional (anisotropic) etching process such as RIE.

Source and drains 906 are then formed in the trenches 806 on opposite sides of the sacrificial layers 206a', 206a" and 206a'" and active layers 208a', 208a" and 208e. According to an exemplary embodiment, source and drains 906 are formed from an in-situ doped (i.e., during growth) or ex-situ doped (e.g., via ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B), aluminum (Al) and/or gallium (Ga). With inner spacers 904 in place along the FET stacks 212a', 212a" and 212a'" sidewall, epitaxial growth of the source and drains 906 is templated from the (exposed) ends of active layers 208a', 208a" and 208a'".

Following formation of the source and drains 906, the sacrificial gates 802 are selectively removed. To do so, the sacrificial gates 802 are first surrounded in an interlayer dielectric (ILD) 908. Suitable ILD materials include, but are not limited to, oxide low-κ materials such as SiOx and/or oxide ULK-ILD materials such as pSiCOH. A process such as CVD, ALD or PVD can be employed to deposit ILD 908 around the sacrificial gates 802. Following deposition, ILD 908 can be planarized using a process such as chemical mechanical polishing (CMP).

Sacrificial gates 802 are then selectively removed forming gate trenches 1002 in the ILD 908 over the FET stacks 212a', 212a" and 212a'". See FIG. 10 (a cross-sectional view Y). The sacrificial layers 206a', 206a" and 206a'", now accessible through gate trenches 1002, are then selectively removed. Removal of sacrificial layers 206a', 206a" and 206a'" releases the active layers 208a', 208a" and 208a'" from the FET stacks 212a', 212a" and 212a'" in the channel region of the device. Namely, gaps are now present in the FET stacks 212a', 212a" and 212a'" in between the active layers 208a', 208a" and 208a'" in the channel region of the device. Active layers 208a', 208a" and 208a'" will be used to form the channels of the FET device. The gate trenches 1002 and the gaps in the FET stacks 212a', 212a" and 212a'" enable replacement metal gates, i.e., including a gate dielectric and at least one workfunction-setting metal, to be formed that fully surround a portion of each of the active layers 208a', 208a" and 208a'" in a gate-all-around configuration.

For instance, a conformal gate dielectric 1004 is first deposited into and lining each of the gate trenches 1002 and gaps such that the conformal gate dielectric 1004 is now present on the active layers 208a', 208a" and 208a'" in the channel region of the FET device. See FIG. 10. According to an exemplary embodiment, gate dielectric 1004 is a high-κ material. The term "high-κ," as used herein, refers to a material having a relative dielectric constant κ which is much higher than that of silicon dioxide (e.g., a dielectric constant κ=25 for hafnium oxide ($HfO_2$) rather than 4 for $SiO_2$). Suitable high-κ gate dielectrics include, but are not limited to, $HfO_2$ and/or lanthanum oxide ($La_2O_3$). A process such as CVD, ALD or PVD can be employed to deposit gate dielectric 1004. According to an exemplary embodiment, gate dielectric 1004 has a thickness of from about 1 nanometer (nm) to about 5 nm and ranges therebetween. A reliability anneal can be performed following deposition of gate dielectric 1004. In one exemplary embodiment, the reliability anneal is performed at a temperature of from about 500° C. to about 1200° C. and ranges therebetween, for a duration of from about 1 nanosecond to about 30 seconds and ranges therebetween. Preferably, the reliability anneal is performed in the presence of an inert gas such as a nitrogen-containing ambient.

At least one workfunction-setting metal 1102 is then deposited into the gate trenches 1002 and gaps on the gate dielectric 1004. See FIG. 11 (a cross-sectional view Y). Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. A process such as CVD, ALD or PVD can be employed to deposit the workfunction-setting metal(s) 1102. Following deposition, the metal overburden can be removed using a process such as CMP.

Figure 12:
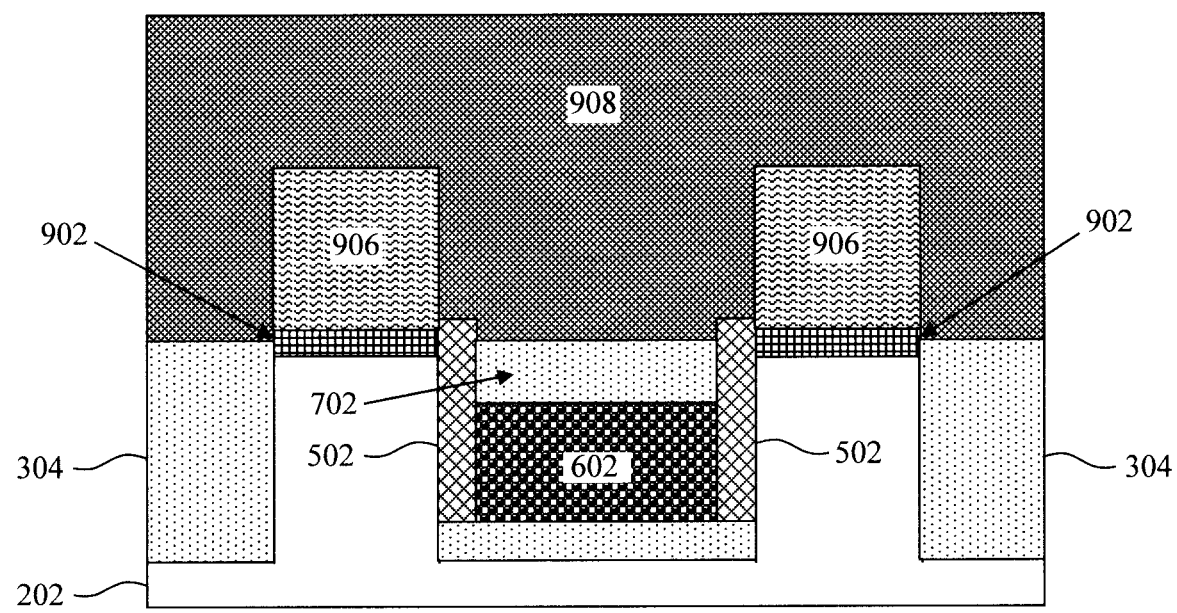
FIG. 12 is a cross-sectional diagram illustrating the source and drains epitaxy to one side of the replacement metal gates in the device stacks, and the bottom dielectric isolation layer separating the source and drains from the substrate from a cross-sectional view through the device stacks between two of the gates in a source and drain region of the device according to an embodiment of the present invention.

Now present is a device structure including at least one gate (i.e., replacement metal gates—gate dielectric 1004 and workfunction-setting metal(s) 1102) with source and drains 906 on opposite sides of the at least one gate. Channel(s) (i.e., active layers 208a', 208a" and 208a'") interconnect the source and drains 906. A buried power rail 602 is embedded in the substrate 202 in between sidewall spacers 502. Referring back to cross-sections X of the device structure which, as highlighted above, provide views of cuts through the device stacks between two of the gates, FIG. 12 depicts a view through the source and drains 906 epitaxy to one side of the replacement metal gates (which are not visible in this depiction) in device stacks 212a and 212b, respectively. As shown in FIG. 12, bottom dielectric isolation layer 902 separates the source and drains 906 from the substrate 202. Bottom dielectric isolation layer 902 prevents source-to-drain leakage via the substrate 202.

The next task is to form a buried contact to the buried power rail 602 and source and drains 906. As provided above, the buried contact will have a sloped architecture to optimize contact resistance to the source and drains 906.

Figure 13:
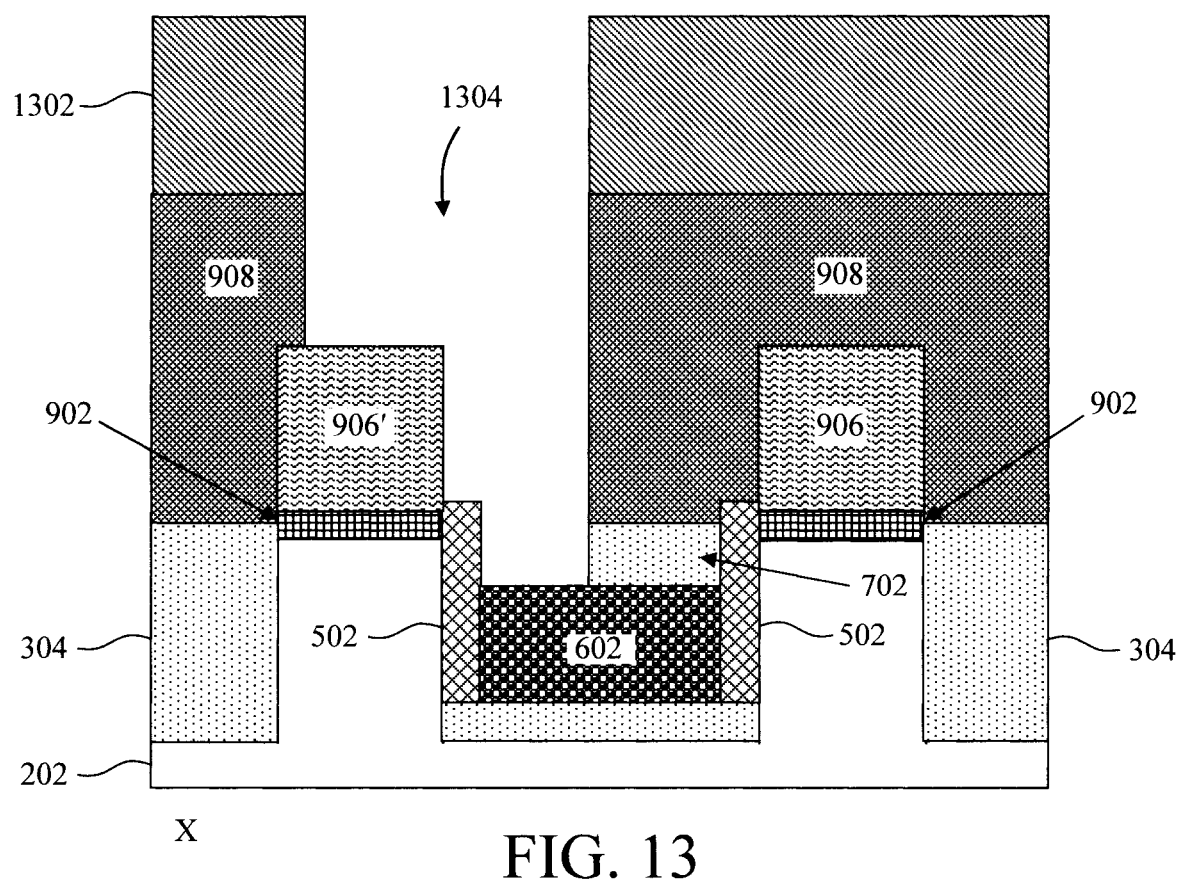
FIG. 13 is a cross-sectional diagram illustrating a contact trench having been patterned in the additional dielectric and the ILD exposing at least a portion of at least one of the source and drains from a cross-sectional view through the device stacks between two of the gates in a source and drain region of the device according to an embodiment of the present invention.
Figure 14:
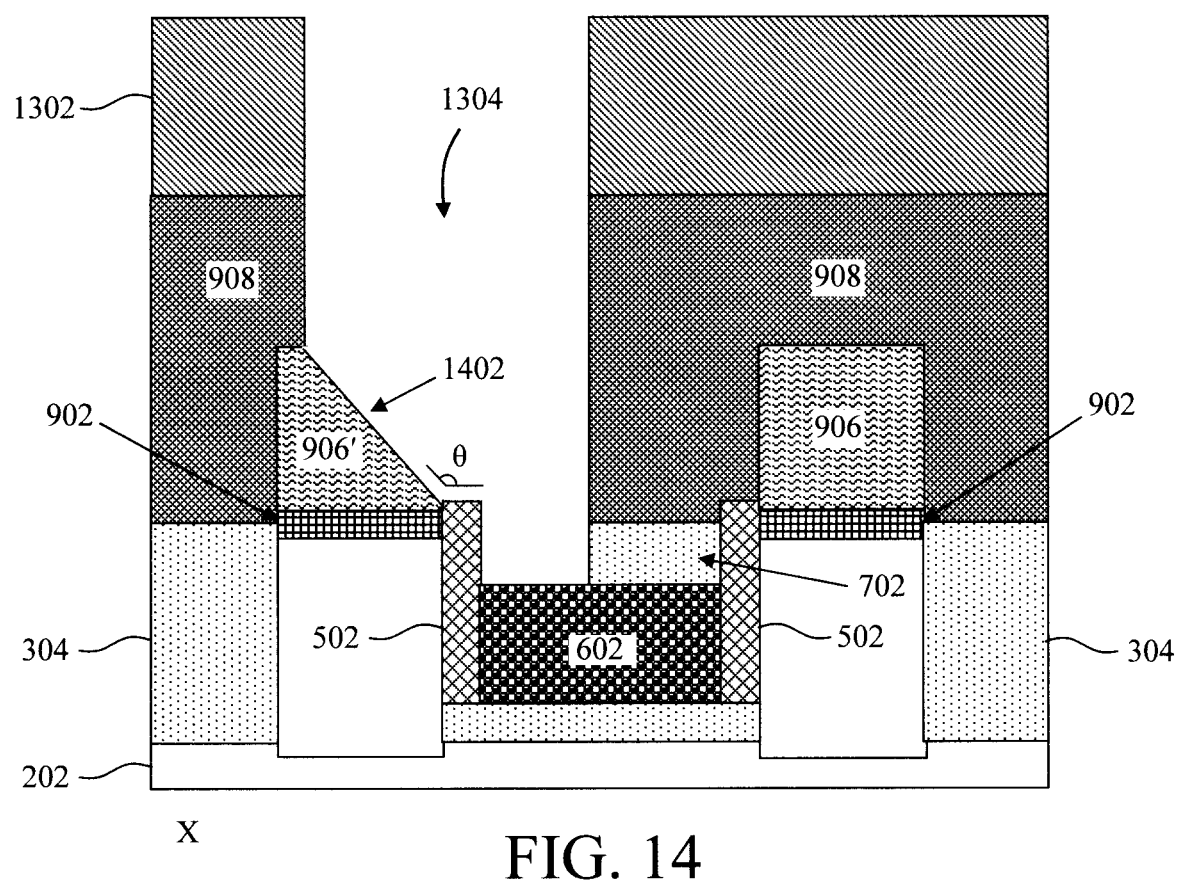
FIG. 14 is a cross-sectional diagram illustrating an etch having been employed to produce a downward sloped surface along the exposed portion of the at least one source and drain from a cross-sectional view through the device stacks between two of the gates in a source and drain region of the device according to an embodiment of the present invention.
Figure 15:
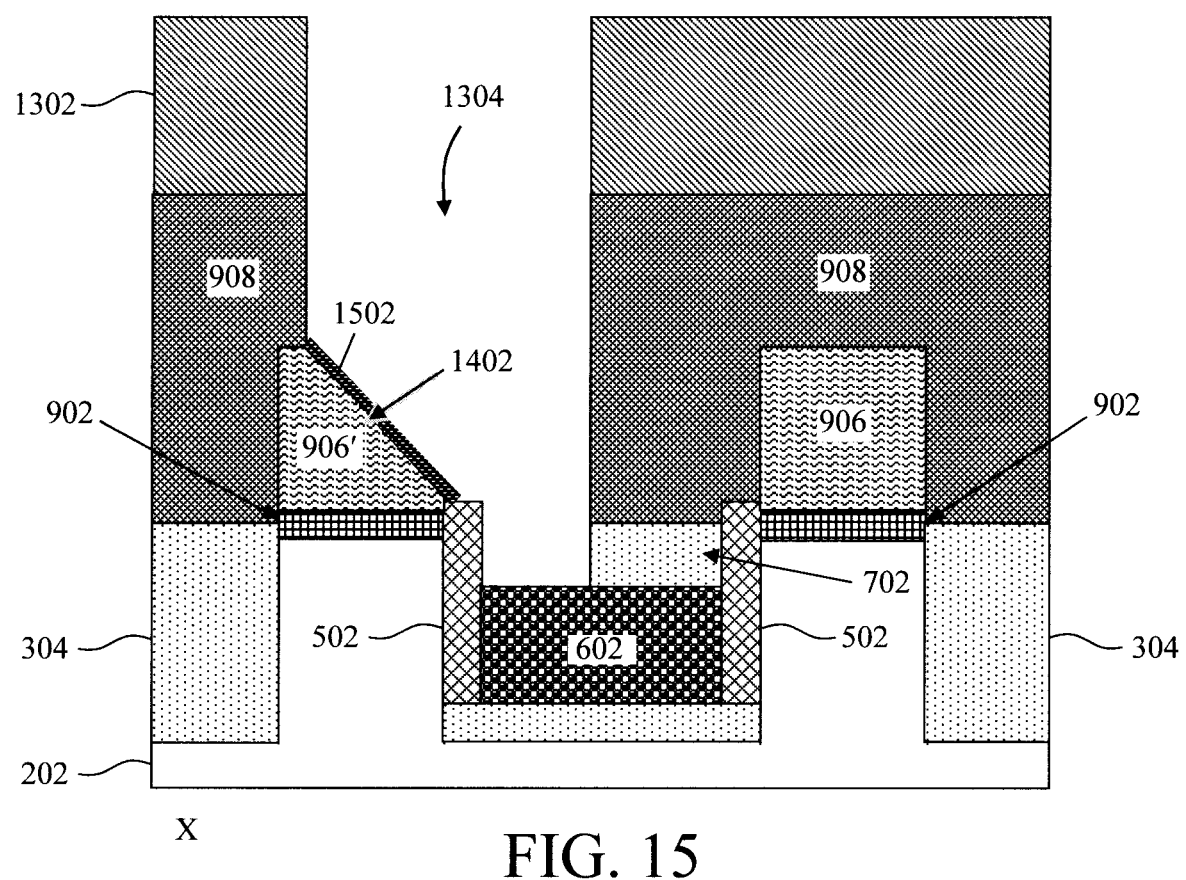
FIG. 15 is a cross-sectional diagram illustrating an optional trench epitaxy layer having been grown on the exposed sloped surface within the contact trench from a cross-sectional view through the device stacks between two of the gates in a source and drain region of the device according to an embodiment of the present invention.
Figure 16:
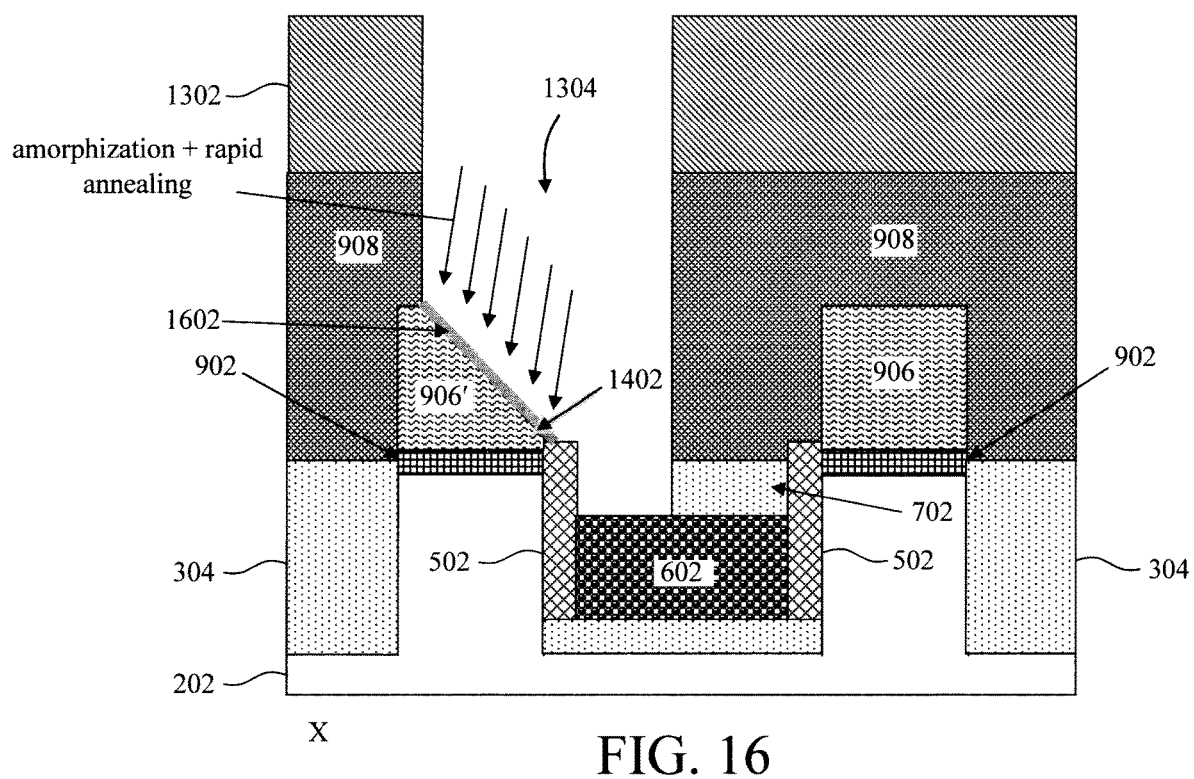
FIG. 16 is a cross-sectional diagram illustrating an epitaxy amorphization implant and rapid laser annealing having been performed to reduce contact resistance along the sloped surface of the at least one source and drain and between the sloped surface of the at least one source and drain and the buried metal contact from a cross-sectional view through the device stacks between two of the gates in a source and drain region of the device according to an embodiment of the present invention.

To form the buried contact, a contact trench 1304 is first patterned in the dielectric 702 and ILD 908. See FIG. 13 (a cross-sectional view X). To do so, a patterned block mask 1302 is formed on the ILD 908 marking the footprint and location of the contact trench 1304. Suitable materials for the block mask 1302 include, but are not limited to, an OPL material. An etch is then performed using block mask 1302 to form the contact trench 1304 shown in FIG. 13. A directional (anisotropic) etching process such as RIE can be employed for the contact trench etch. Preferably, the etch chemistry used is selective for etching dielectric 702 and ILD 908 over sidewall spacers 502. That way, the contact trench etch is self-aligned to the sidewall spacers 502, preventing buried contact shorts to the substrate 202. By way of example only, as provided above dielectric 702 and ILD 908 can be oxide low-κ materials such as SiOx and/or oxide ULK-ILD materials such as pSiCOH, whereas sidewall spacers 502 can be formed from SiC and/or SiOC. In that case, a directional etching process such as RIE etch can be employed to pattern dielectric 702 and ILD 908 selective to sidewall spacers 502. By way of example only, an $SF_6/O_2$-based RIE can provide the etch selectivity needed. See, for example, Oda et al., "Optimizing the SiC Plasma Etching Process For Manufacturing Power Devices," CS MANTECH Conference, pps. 125-128 (May 2015), the contents of which are incorporated by reference as if fully set forth herein. As shown in FIG. 13, at least a portion of the buried power rail 602 is now exposed at the bottom of the contact trench 1304.

As shown in FIG. 13, at least a portion of at least one of the source and drains (hereinafter given reference numeral 906') is also exposed within the contact trench 1304. An etch is then employed to produce a downward sloped surface 1402 along the exposed portion of source and drain 906'. See FIG. 14 (a cross-sectional view X). According to an exemplary embodiment, surface 1402 is sloped at an angle θ of from about 95° to about 150° and ranges therebetween. By way of example only, the sloped surface 1402 along source and drain 906' is produced using a directional and crystallographic-dependent etch process for the etch of source and drain 906'. See, for example, U.S. Pat. No. 9,287,123 issued to Srinivasan et al., entitled "Techniques for Forming Angled Structures for Reduced Defects in Heteroepitaxy of Semiconductor Films," the contents of which are incorporated by reference as if fully set forth herein. Alternatively, another way to produce the sloped surface 1402 along source and drain 906' is to pattern block mask 1302 having tapered sidewalls (not shown) using an etching process such as RIE. These tapered sidewalls will be transferred to ILD 908 during the ILD 908 open. An etching process such as RIE can then be used for the etch of source and drain 906' which, based on the tapered sidewalls, will be sloped. As will be described in detail below, re-shaping the surface of the source and drain 906' in this manner within the contact trench 1304 advantageously enables use of an amorphization implant and an epitaxial re-growth induced by a low-thermal-budget annealing, for instance, laser annealing (LA) to reduce contact resistance along the sloped surface 1402 and between semiconductor and buried contact.

Etching processes such as RIE can result in damage to the sloped surface 1402 and can leave a contamination residue on the sloped surface 1402. Thus, according to an exemplary embodiment, a thin, trench epitaxy layer 1502 is optionally grown on the exposed sloped surface 1402 within contact trench 1304. See FIG. 15 (a cross-sectional view X). Doing so improves the quality of the epitaxial material along the sloped surface 1402 of source and drain 906' and, if so desired, can also be used to adjust the material composition of the epitaxial material of source and drain 906' along the sloped surface 1402. As with source and drains 906/906', layer 1502 can be formed from an in-situ or an ex-situ doped epitaxial material such as epitaxial Si, epitaxial SiGe, etc. As provided, suitable n-type dopants include, but are not limited to, P and/or As, and suitable p-type dopants include, but are not limited to, B, Al and/or Ga. The choice of dopant is dependent on the host semiconductor material and the dopant with a high solid solubility is preferably selected. The trench epitaxy layer 1502 can be different for n-channel FET (nFET) and p-channel FET (pFET) devices. If different trench epitaxy layers 1502 are used for different (e.g., nFET and pFET) devices, standard blocking and patterning techniques are employed to block a first set of devices and open a second set of devices and to grow the trench epitaxy layer 1502 selectively on the sloped surfaces 1402 of the second set of devices, and then repeating this sequence for selectively growing trench epitaxy layer 1502 on the sloped surfaces 1402 of the first set of devices. According to one exemplary embodiment, the trench epitaxy layer 1502 is Si doped with phosphorus (P) in excess of $1 \times 10^{21}$ atoms/cm$^3$ (equivalently, in excess of 2 atomic percent (at. %)) for nFET devices and the trench epitaxy layer 1502 is SiGe with a Ge content higher than that in the source and drains 906/906' and in excess of 60 atomic percent (at. %) doped with gallium (Ga) in excess of $1 \times 10^{21}$ atoms/cm$^3$ (equivalently, in excess of 2 at. %) for pFET devices. According to an exemplary embodiment, trench epitaxy layer 1502 has a thickness of from about 1 nanometers (nm) to about 7 nm and ranges therebetween.

In either case, whether the optional trench epitaxy layer 1502 is employed or not, an epitaxial re-growth of an amorphized surface layer is then performed to form a surface dopant-semiconductor alloy layer with a high concentration of activated dopant, i.e., contact layer 1602. See FIG. 16 (a cross-sectional view X). The activated dopant contributes to free electrical carriers (electrons and holes) and reduces a contact resistivity along and between the sloped surface 1402 of source and drain 906' and the metallic material of a buried contact 1702 that will be formed adjacent to the sloped surface 1402 (see FIG. 17—described below). Generally, an amorphization implant is used to intentionally destroy the ordered crystalline structure of the material into which the implant is being performed. An amorphization implant also destroys bonding arrangements between dopants, for instance, by breaking bonds within dopant clusters and forming a more homogeneous mix of host semiconductor and dopant atoms of target concentrations or proportions. Depending on the dopant concentration level in sloped surface 1402 and/or (optional) trench epitaxy layer 1502, the amorphization implant may be selected to add dopants to the amorphized contact layer 1602 in order to bring the dopant concentration to a target level. The amorphization implant can employ ions of dopants or electrically neutral elements (e.g., ions of underlying host semiconductor constituents such as ions of Si and/or Ge). Because of inherent random placement of dopants into amorphized sloped surface 1402/(optional) trench epitaxy layer 1502 during the implantation process, the resultant doped amorphous material typically has a more homogeneous distribution of dopants than a doped material amorphized by neutral atoms/ions. Laser annealing is then performed to recrystallize the amorphized material.

The recrystallization process activates the dopants by integrating the dopant atoms into the growing crystal lattice. The duration of the laser annealing is selected to be short (see below) for preserving activated dopants but substantial enough to allow for a full recrystallization of amorphous material. Short annealing duration enables a rapid temperature quenching to lock up dopant atoms in the semiconductor crystal lattice. Furthermore, the annealing temperature and duration or, equivalently, the anneal thermal budget is selected to be small enough such that the gate dielectric 1004 and the workfunction-setting metal 1102 are not impacted by it, for instance, the gate dielectric 1004 equivalent electrical thickness (EOT) does not increase by more than 0.25 Angstroms (Å) due to this rapid annealing. Suitable millisecond or nanosecond annealing processes can satisfy these thermal budget requirements and enable the semiconductor recrystallization and a fast temperature quenching for locking up activated dopants. By way of example only, millisecond annealing can be in the form of flash lamp or laser annealing, and nanosecond annealing can be in the form laser or electron beam annealing. The characteristic duration of these rapid anneals range from about 30 milliseconds to about 10 nanoseconds and ranges therebetween. In one exemplary embodiment, rapid laser annealing (LA), also referred to herein as 'rapid LA' refers to a wide range of laser anneal durations from about 10 milliseconds to about 10 nanoseconds and ranges therebetween. The resultant surface semiconductor-dopant alloy, i.e., contact layer 1602 is metastable with an active dopant concentration exceeding the maximum thermodynamically-allowed value (i.e., the thermodynamic limit). The thermodynamic limit for an active dopant is related to a maximum solid solubility of the dopant in a host material. The thermodynamic limit for an active dopant is typically one quarter of its maximum solid solubility. For a high solid solubility dopant, the thermodynamic limit for an active dopant is from about $2 \times 10^{20}$ cm$^{-3}$ to about $4 \times 10^{20}$ cm$^{-3}$ and ranges therebetween. A surface amorphization and fast recrystallization sequence allows for achieving an active dopant content in contact layer 1602 of greater than or equal to about $2 \times 10^{21}$ cm$^3$ or, equivalently, greater than or equal to about 2 at. %. Advantageously, the formation of contact layer 1602 with a high active dopant content will result in a low contact resistivity ($\rho_c$) between the contact layer 1602 of source and drain 906' and adjacent metallic material of buried contact 1702, as described below.

The amorphization implant is facilitated by the sloped surface 1402 of source and drain 906'. Namely, it is difficult to perform an amorphization implant into vertical surfaces. To look at it another way, if one were to forego re-shaping the source and drain within contact trench 1304 and instead perform the surface amorphization and fast recrystallization sequence on a source and drain epitaxy having both horizontal and vertical surfaces, then it is likely that only the horizontal surfaces would receive proper treatment which would result in contact layer 1602 being formed only on horizontal surfaces yielding an increased contact resistance Rc.

According to another exemplary embodiment, the composition of sloped surface 1402 and/or (optional) trench epitaxy layer 1502 is silicon doped with about $3 \times 10^{21}$ atoms/cm$^3$ of phosphorus (P) for nFET devices, and SiGe with a Ge content of greater than about 60% and doped with about $1 \times 10^{21}$ atoms/cm$^3$ of boron (B) for pFET devices. Aluminum (Al) and gallium (Ga) are high solid solubility dopants for SiGe with a Ge content greater than about 60% and, in this example, are absent from pFET sloped surface 1402/(optional) trench epitaxy layer 1502. Hence, Ga ions are suitable as an amorphization ion implant for the pFET devices. A suitable standard block mask is disposed and patterned blocking the nFET devices while exposing the pFET devices, and Ga ion implantation is performed with zero degree tilt into the exposed pFET source/drain sloped surface 1402/(optional) trench epitaxy layer 1502. In one exemplary embodiment, the Ga implantation energy is from about 1 kiloelectron volt (keV) to about 8 keV and ranges therebetween, e.g., about 4 keV, and the Ga ion implantation dose is from about $1 \times 10^{15}$ atoms/cm$^2$ to about $5 \times 10^{15}$ atoms/cm$^2$ and ranges therebetween, e.g., about $2.5 \times 10^{15}$ atoms/cm$^2$. A cold amorphization implant can be performed at sub room temperature (e.g., at a wafer temperature of minus 100° C.) to facilitate the crystal amorphization process. The resultant amorphous layer thickness on the pFET source/drain sloped surfaces is from about 3 nm to about 12 nm, and ranges therebetween, e.g., about 7 nm which is near optimum. In one exemplary embodiment, the resulting concentration of Ga in the amorphized SiGe layer is from about $2 \times 10^{21}$ atoms/cm$^3$ to about $5 \times 10^{21}$ atoms/cm$^3$, e.g., $3 \times 10^{21}$ atoms/cm$^3$ which is near optimum. A similar aluminum ion amorphization implant can be alternatively used in this exemplary embodiment.

The block mask is then stripped from nFET devices without any impact to the amorphous surface layer already present in the pFET source/drain. Phosphorus is a high solid solubility dopant for silicon and is present in a sufficient amount in nFET sloped surface 1402/(optional) trench epitaxy layer 1502, hence Ge ions are selected as an amorphization ion implant for nFET devices. Because Ge is electrically neutral with respect to Si and SiGe doping, an additional block mask is not needed, thereby reducing cost, and Ge ion implantation is performed with zero degree tilt into exposed nFET and pFET source/drain sloped surface 1402/trench epitaxy layer 1502. According to an exemplary embodiment, the Ge implantation energy is from about 1 keV to about 8 keV and ranges therebetween, e.g., about 4 keV, and the Ge implantation dose is from about $1 \times 10^{14}$ atoms/cm$^2$ to $5 \times 10^{14}$ atoms/cm$^2$ and ranges therebetween, e.g., about $2 \times 10^{14}$ atoms/cm$^2$. Cold amorphization implant can be performed at sub room temperature (e.g., at a wafer temperature of minus 100° C.) to facilitate the crystal amorphization process. In one exemplary embodiment, the resultant amorphous layer thickness on the nFET source/drain sloped surfaces is from about 3 nm to about 12 nm and ranges therebetween, e.g., about 7 nm—which is near optimum. The amorphous layer thickness present on pFET source/drain sloped surfaces remains near optimum. Due to the low dose of implanted Ge, the chemical composition of both nFET and pFET sloped surface 1402/trench epitaxy layer 1502 does not change appreciably. The resultant concentration of P in amorphized Si layer remains at about $1 \times 10^{21}$ atoms/cm$^3$. Forming surface amorphous layers along respective nFET and pFET source/drain sloped surfaces 1402/trench epitaxy layer 1502 is followed by a rapid LA to re-crystallize the material and to create a metastable semiconductor-dopant alloy contact layer 1602 with a high concentration of active dopant.

According to one exemplary embodiment, a solid phase epitaxy (SPE) or a solid epitaxial re-growth is induced by rapid laser annealing (LA). Such laser annealing process is performed at temperature of from about 800° C. to about 950° C. and ranges therebetween, for a duration of from about 50 microseconds to about 3 milliseconds and ranges therebetween. A triangular temperature-time laser spike annealing process can be used for this purpose. The preferred peak temperature for a laser spike annealing process is from about 800° C. to about 950° C. and ranges therebetween, and preferred duration at 50 degrees below peak temperature is from about 50 microseconds to about 250 microseconds and ranges therebetween. This can be performed using a millisecond laser annealer. According to another exemplary embodiment, a liquid phase epitaxy (LPE) or a liquid epitaxial re-growth is induced by rapid laser anneal. Such laser annealing process is performed at a temperature of from about 1200° C. to about 1300° C. and ranges therebetween, for a duration of from about 10 nanoseconds to about 1000 nanoseconds and ranges therebetween. This can be performed using a nanosecond melt laser annealer. Advantageously, the nanosecond melt laser annealer may include a combination of millisecond laser annealing and nanosecond laser annealing. By way of example only, the LPE-inducing laser annealing can be conducted with a millisecond-scale temperature ramping to an intermediate temperature of from about 600° C. to about 750° C. and ranges therebetween, with an overlaid nanosecond temperature spike to above the melting point of source and drain amorphized material in sloped surface 1402/trench epitaxy layer 1502. Both laser-induced SPE and LPE result in forming contact layer 1602 with a high active dopant content of at or above about $10^{21}$ cm$^{-3}$ that leads to a low contact resistivity (pc) between the contact layer 1602 of source and drain 906' and adjacent metallic material of buried contact 1702, as described below.

A metal or a combination of metals is then deposited into contact trench 1304 and onto sloped contact layer 1602, and then recessed to form buried contact 1702 that connects the buried power rail 602 to the sloped contact layer 1602 of source and drain 906'. See FIG. 17 (a cross-sectional view X).

Contact resistance between metallic materials and doped semiconductors is a bottleneck in scaled down semiconductor devices where the contact area is small. Accordingly, the metallic compounds directly adjacent to the source/drain are typically selected to form a low contact resistivity to a doped semiconductor material of the source/drain. The contact resistivity of a semiconductor-metal interface is a material property and depends on both the active concentration of dopant in the adjacent semiconductor and the Schottky barrier height between the adjacent metallic compound and the semiconductor. A higher concentration of active dopant leads to a lower contact resistivity, and a reduced Schottky barrier height leads to a lower resistivity. Various approaches for reducing Schottky barrier height can be used including forming silicide or germanosilicide interfacial metallic compounds that are different for nFET and pFET source/drains. For instance, nickel and platinum germanosilicide reduces Schottky barrier height for pFET devices while titanium silicide reduces Schottky barrier height for nFET devices. This approach requires complex processing schemes for forming different metal stacks for the buried contact 1702 for pFET and nFET devices. The state-of-the-art contact resistivity between silicides/germanosilicides and doped semiconductors is about $2 \times 10^{-9}$ Ω·cm$^2$. Advantageously, the presence of contact layer 1602 with a high active dopant content allows for achieving contact resistivities less than or equal to about $1 \times 10^{-9}$ Ω·cm$^2$ with most silicides/germanosilicides. This greatly simplifies the buried contact structure and fabrication process such that a single metallic stack can be used everywhere while allowing for achieving ultra-low contact resistivity with n- and p-doped semiconductors.

According to one exemplary embodiment, the surface of contact layer 1602 is cleaned immediately prior to depositing the metals into contact trench 1304 to remove any native oxide and a thin Ti/TiN stack (not shown) is deposited onto the cleaned contact layer 1602 surface without exposing it to an oxidizing ambient. A process such as sputtering, evaporation, chemical vapor deposition, atomic layer deposition, or a combination thereof can be used to deposit the Ti/TiN stack into contact trench 1304. The purpose of the Ti is to form an interfacial titanium silicide/germanosilicide 1701 and the purpose of the TiN is to protect the Ti against oxidation and other chemical attacks. In one exemplary embodiment, the thickness of the Ti is less than about 5 nm, and the thickness of the TiN is also less than about 5 nm.

Interfacial titanium silicide and/or germanosilicide 1701 is then formed by subjecting the structure to a rapid thermal anneal that preserves the metastable semiconductor-dopant alloy of contact layer 1602. An exemplary silicidation anneal is a millisecond anneal performed at a temperature of about 800° C. for a duration of from about 50 microseconds to about 3 milliseconds and ranges therebetween, and is similar to the SPE-inducing laser anneal described above. The silicidation anneal can be conducted immediately after depositing Ti/TiN stack or later on in the process sequence. The remainder of trench 1304 is then filled with an elemental metal to reduce series electrical resistance of metallic buried contact 1702. Suitable elemental metals for buried contact 1702 include, but are not limited to Cu, Co, Ru and/or W. A process such as sputtering, evaporation, electrochemical plating, chemical vapor deposition, atomic layer deposition, or a combination thereof can be used to deposit the elemental metal(s) into contact trench 1304, followed by a chemical mechanical polishing and metal-selective recess etch.

Figure 17:
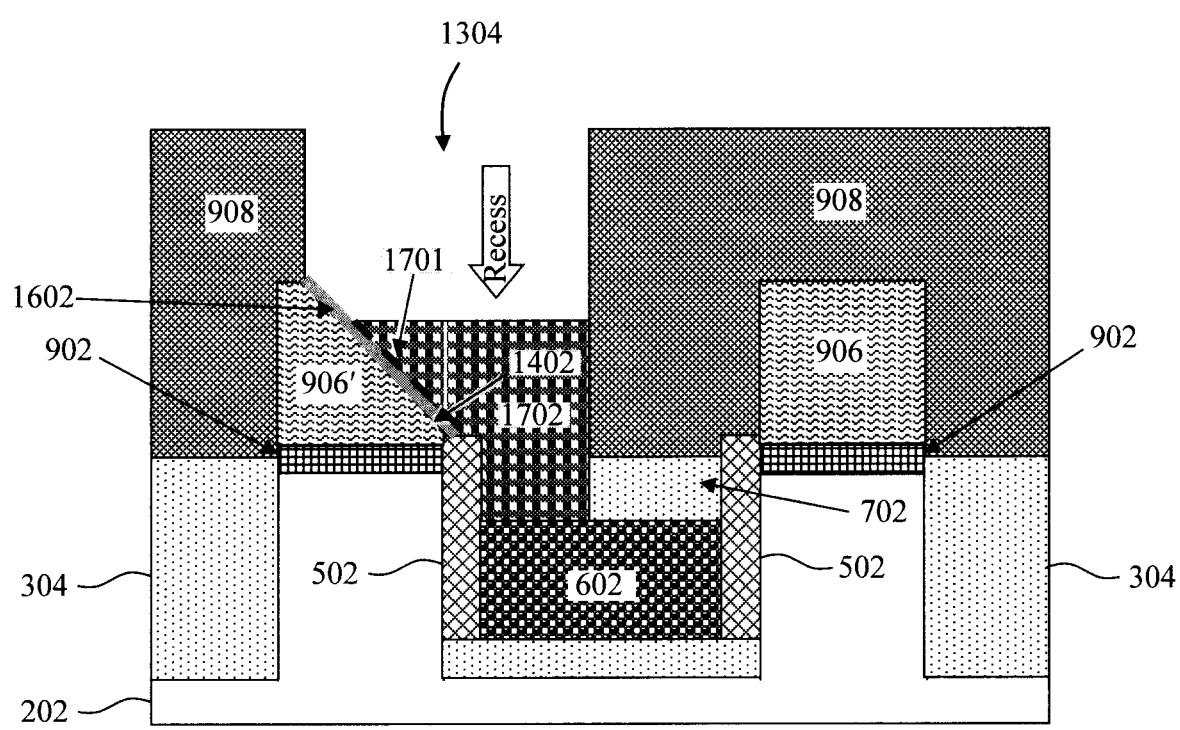
FIG. 17 is a cross-sectional diagram illustrating a buried contact having been formed in the contact trench that connects the buried power rail to the sloped surface of the at least one source and drain from a cross-sectional view through the device stacks between two of the gates in a source and drain region of the device according to an embodiment of the present invention.

Metal-metal interfaces have a low contact resistivity of less than about $1 \times 10^{-10}$ $\Omega \cdot cm^2$ and their resistance can typically be neglected with respect to that of semiconductor-metal interface, but the presence of up to three metal-metal interfaces (silicide/Ti/TiN/elemental metal) may be detrimental if the semiconductor-metal resistivity is less than $1 \times 10^{-9}$ $\Omega \cdot cm^2$. In addition, the presence of multiple metallic layers increases the series resistance of buried contact 1702 for narrow trenches 1304. Advantageously, the presence of sloped contact layer 1602 with a high active dopant content allows for simplifying the buried contact structure even further. A single elemental metal is selected to form a suitable interfacial silicide/germanosilicide achieving semiconductor contact resistivities at or below $1 \times 10^{-9}$ $\Omega \cdot cm^2$ for both n- and p-doped semiconductors and enabling a low series resistance of buried contact 1702. In this exemplary embodiment, a single suitable elemental metal for buried contact 1702 includes, but is not limited to Co, Ru, and/or W forming respective cobalt, ruthenium, or tungsten silicides and germanosilicides. As shown in FIG. 17, buried contact 1702 directly contacts the buried power rail 602. Buried contact 1702 contacts layer 1602 though the interfacial silicide or germanosilicide compound 1701 along the sloped surface 1402 of source and drain 906'. The contact resistance Rc between semiconductor source and drain 906/906' and buried metal contact 1702 is reduced if the contact resistivity pc is decreased and the contact area is increased. An ultra-low contact resistivity of less than or equal to about $1 \times 10^{-9}$ $\Omega \cdot cm^2$ is achieved along the entire sloped contact layer 1602 for both n- and p-doped semiconductors. The sloped surface of contact layer 1602 has a larger contact area than a purely horizontal contact surface thus allowing for a further reduction in the contact resistance Rc.

Sidewall spacers 502 alongside the buried power rail 602 and the buried contact 1702 separate the buried power rail 602 and the buried contact 1702 from the substrate 202. As also shown in FIG. 17, a top of the sloped surface 1402 of source and drain 906' is preferably higher than (i.e., is above) a top surface of buried contact 1702. Doing so will optimize the spacing between buried contact 1702 and an adjacent source and drain contact (see below).

Figure 18:
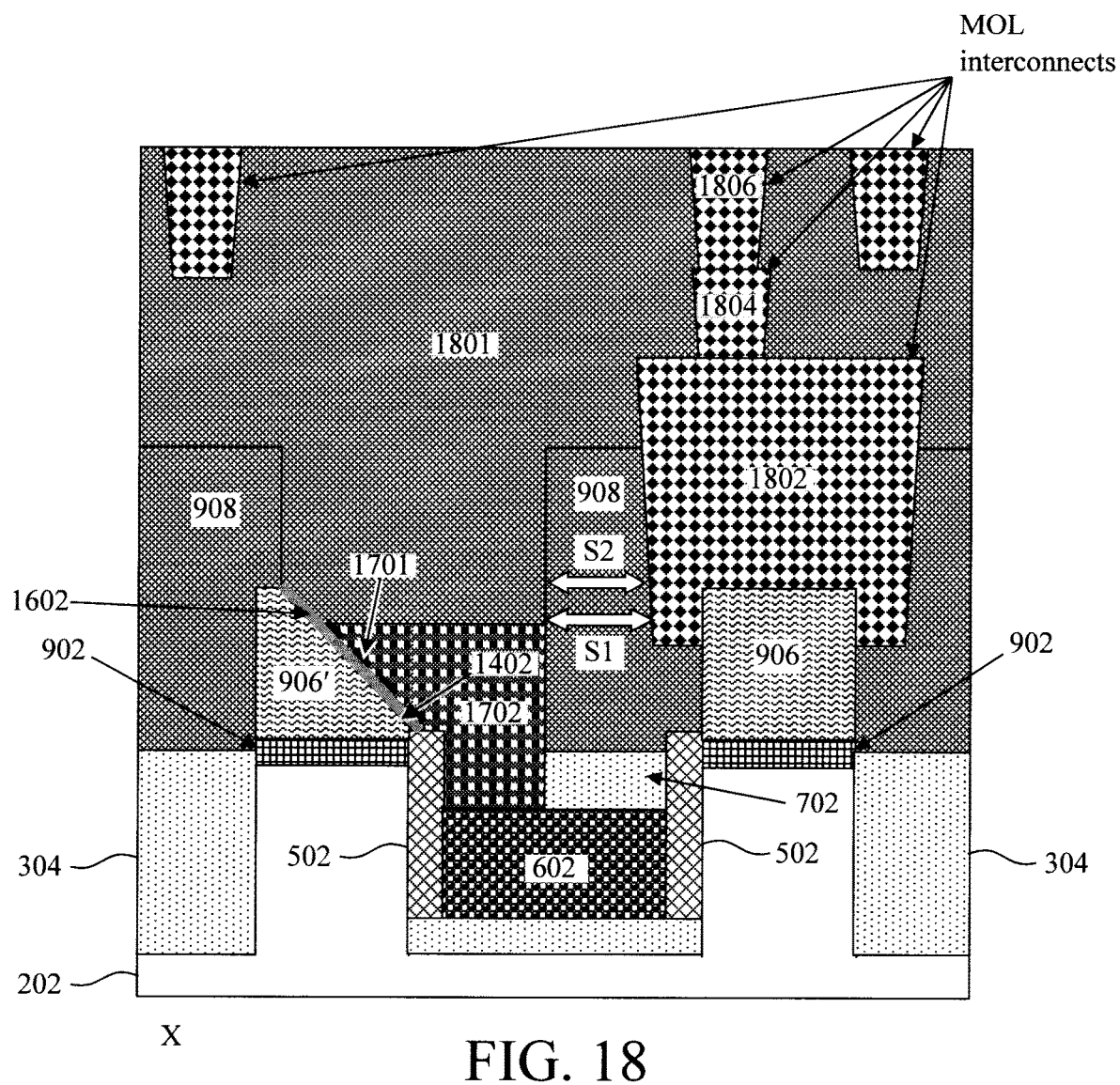
FIG. 18 is a cross-sectional diagram illustrating metallization techniques having been employed to complete the device structure from a cross-sectional view through the device stacks between two of the gates in a source and drain region of the device according to an embodiment of the present invention.

Middle-of-line (MOL) metallization techniques are then employed to complete the semiconductor FET device structure. For instance, as shown in FIG. 18 (a cross-sectional view X), a (second) ILD 1801 is deposited onto (first) ILD 908, filling contact trench 1304 over buried contact 1702. As provided above, suitable ILD materials include, but are not limited to, oxide low-κ materials such as SiOx and/or oxide ULK-ILD materials such as pSiCOH. A process such as CVD, ALD or PVD can be employed to deposit ILD 1801. Following deposition, ILD 1801 can be planarized using a process such as CMP.

So called damascene or dual damascene processes are then employed to form interconnects in ILD 908 and/or ILD 1801. With a damascene or dual damascene process, lithography and etching techniques are first employed to pattern features (e.g., vias and/or trenches) in a dielectric which are then filled with a contact metal(s) to form the interconnects (e.g., conductive vias and/or metal lines). With a dual damascene process, when the vias are patterned before the trenches it is also referred to herein as a 'via-first process.' Conversely, when the trenches are patterned before the vias, it is referred to herein as a 'trench-first process.'

Suitable contact metals include, but are not limited to, copper (Cu), tungsten (W), ruthenium (Ru), cobalt (Co), nickel (Ni) and/or platinum (Pt). The contact metal(s) can be deposited into the features using a process such as evaporation, sputtering, or electrochemical plating. Following deposition, the overburden can be removed using a process such as CMP. Prior to depositing the contact metal(s) into the features, a conformal barrier layer (not shown) can be deposited into and lining the features. Use of such a barrier layer helps to prevent diffusion of the contact metal(s) into the surrounding dielectric. Suitable barrier layer materials include, but are not limited to, ruthenium (Ru), tantalum (Ta), tantalum nitride (TaN), titanium (Ti), and/or titanium nitride (TiN). Additionally, a seed layer (not shown) can be deposited into and lining the features prior to contact metal deposition. A seed layer facilitates plating of the contact metal into the features.

As illustrated in FIG. 18, contact to source and drain 906' is made via buried contact 1702 and buried power rail 602, and contact to the source and drain 906 is made via a source and drain contact 1802, a source and drain contact 1804 and a metal line 1806. Notably, the spacing between the buried contact 1702 and the source and drain contact 1802 is optimized by having the top surface of buried contact 1702 recessed below the top of the sloped surface 1402 of source and drain 906'. To look at it another way, increasing the height of the buried contact 1702 would undesirably decrease the spacing between the buried contact 1702 and the source and drain contact 1802, i.e., from S1 to S2, where S2<S1.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A semiconductor field-effect transistor (FET) device, comprising:
   at least one gate disposed on a substrate;
   source and drains on opposite sides of the at least one gate, wherein at least one of the source and drains has a sloped surface;
   a surface dopant-semiconductor alloy contact layer disposed on the at least one of the source and drains but along only the sloped surface;
   a buried power rail embedded in the substrate; and
   a buried contact that connects the buried power rail to the sloped surface of the at least one source and drain.

2. The semiconductor FET device of claim 1, further comprising:
   sidewall spacers alongside the buried power rail that separate the buried power rail from the substrate, wherein the sidewall spacers also separate the buried contact from the substrate.

3. The semiconductor FET device of claim 2, wherein the sidewall spacers comprise a material selected from the group consisting of: silicon carbide (SiC), silicon oxycarbide (SiOC), and combinations thereof.

4. The semiconductor FET device of claim 1, wherein a top of the sloped surface of the at least one source and drain is above a top surface of the buried contact.

5. The semiconductor FET device of claim 1, wherein the buried power rail comprises a metal selected from the group consisting of: copper (Cu), cobalt (Co), ruthenium (Ru), tungsten (W), and combinations thereof.

6. The semiconductor FET device of claim 1, wherein the sloped surface of the at least one source and drain is sloped at an angle θ of from about 95° to about 150° and ranges therebetween.

7. The semiconductor FET device of claim 1, further comprising:
   a trench epitaxial layer disposed on the sloped surface.

8. The semiconductor FET device of claim 1, wherein the buried contact comprises a metal selected from the group consisting of: Cu, Co, Ru, W, and combinations thereof.

9. The semiconductor FET device of claim 1, further comprising:
   a bottom dielectric layer separating the source and drains from the substrate.

10. The semiconductor FET device of claim 1, further comprising:
    at least one active layer interconnecting the source and drains.

11. A semiconductor FET device, comprising:
    at least one gate disposed on a substrate;
    source and drains on opposite sides of the at least one gate, wherein at least one of the source and drains has a sloped surface;
    a surface dopant-semiconductor alloy contact layer disposed on the at least one of the source and drains but along only the sloped surface;
    a buried power rail embedded in the substrate below the sloped surface;
    sidewall spacers separating the buried power rail from the substrate; and
    a buried contact that connects the buried power rail to the sloped surface of the at least one source and drain, wherein a top of the sloped surface of the at least one source and drain is above a top surface of the buried contact.

12. The semiconductor FET device of claim 11, wherein the sloped surface of the at least one source and drain is sloped at an angle θ of from about 95° to about 150° and ranges therebetween.

13. The semiconductor FET device of claim 11, further comprising:
    a trench epitaxial layer disposed on the sloped surface.

14. The semiconductor FET device of claim 11, further comprising:
    a bottom dielectric layer separating the source and drains from the substrate.

15. The semiconductor FET device of claim 11, further comprising:
    at least one active layer interconnecting the source and drains.

16. The semiconductor FET device of claim 15, further comprising:
    multiple vertically stacked active layers interconnecting the source and drains.

17. A method of forming a semiconductor FET device, the method comprising the steps of:
    forming a device structure comprising at least one gate disposed on a substrate, source and drains on opposite sides of the at least one gate, and a buried power rail embedded in the substrate;
    etching at least one of the source and drain to produce a sloped surface along a portion of the at least one source and drain; and
    forming a buried contact that connects the buried power rail to the sloped surface of the at least one source and drain, wherein a top of the sloped surface of the at least one source and drain is above a top surface of the buried contact.

18. The method of claim 17, further comprising the step of:
    growing a trench epitaxy layer on the sloped surface of the at least one source and drain.

19. The method of claim 17, further comprising the step of:
    performing epitaxial re-growth to form a surface dopant-semiconductor alloy contact layer on the sloped surface.

20. A method of forming a semiconductor FET device, the method comprising the steps of:
    forming a device structure comprising at least one gate disposed on a substrate, source and drains on opposite sides of the at least one gate, an interlayer dielectric (ILD) surrounding the at least one gate, and a buried power rail embedded in the substrate;
    patterning a contact trench in the ILD to expose at least one of the source and drains;
    etching that at least one source and drain to produce a sloped surface along a portion of the at least one source and drain exposed in the contact trench;
    performing epitaxial re-growth to form a surface dopant-semiconductor alloy contact layer on the sloped surface; and
    forming a buried contact in the contact trench that connects the buried power rail to the sloped surface of the at least one source and drain, wherein a top of the sloped surface of the at least one source and drain is above a top surface of the buried contact.

21. The method of claim 20, further comprising the step of:
    growing a trench epitaxy layer on the sloped surface of the at least one source and drain.

* * * * *